(12) United States Patent
Hosogane

(10) Patent No.: US 6,418,057 B1
(45) Date of Patent: Jul. 9, 2002

(54) NONVOLATILE SEMICONDUCTOR MEMORY DEVICE CAPABLE OF CORRECTLY PERFORMING ERASURE/PROGRAMMING COMPLETION DETERMINATION EVEN IN PRESENCE OF DEFECTIVE BIT

(75) Inventor: Akira Hosogane, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/717,248

(22) Filed: Nov. 22, 2000

(30) Foreign Application Priority Data

May 16, 2000 (JP) ......................... 2000-143134

(51) Int. Cl.$^7$ ............................ G11C 16/06; G11C 7/00
(52) U.S. Cl. ................. 365/185.21; 365/205; 365/185.2
(58) Field of Search ................................ 365/205, 200, 365/210, 189.05, 185.21, 185.2

(56) References Cited

U.S. PATENT DOCUMENTS 4,791,616 A * 12/1988 Taguchi et al. ............. 365/205
5,243,573 A * 9/1993 Makihara et al. ........... 365/205
5,524,094 A * 6/1996 Nobukata et al. ....... 365/185.21
5,862,089 A * 1/1999 Raad et al. ................. 365/203

FOREIGN PATENT DOCUMENTS

JP 7-307098 11/1995 ........... G11C/16/06

* cited by examiner

Primary Examiner—Son Mai
(74) Attorney, Agent, or Firm—McDermott, Will & Emery

(57) ABSTRACT

In a data register latching a data on a selected memory cell of a memory array, circuitry is provided for repairing a defect when the defect is present in a latch circuit included in the data register. The defect repairing is implemented by reverse current flow prevention for a latch power supply, of a determination transistor into a non-conductive state, determination with a forcibly setting circuit, inversion of a latch data, switching of current detectors. A product yield is improved by repairing the defect even when the defect is present in a latch circuit section in which a data is latched.

12 Claims, 15 Drawing Sheets

NONVOLATILE SEMICONDUCTOR MEMORY DEVICE CAPABLE OF CORRECTLY PERFORMING ERASURE/ PROGRAMMING COMPLETION DETERMINATION EVEN IN PRESENCE OF DEFECTIVE BIT

BACKGROUND OF THE INVENTION

1. Field of the Invention

The present invention relates to a semiconductor memory device, and particularly, to a nonvolatile semiconductor memory device in which memory cell information is latched in latch circuits and accesses are sequentially made thereto.

2. Description of the Background Art

A nonvolatile memory cell storing information in a nonvolatile manner has a stacked gate structure with a floating gate and a control gate, wherein a threshold voltage is changed according to an amount of changes accumulated in the floating gate and digital information of "1" or "0" is stored thereon according to a high level or a low level of the absolute value of the threshold value. Since the stored information is determined by an electric charge amount in the floating gate, and the floating gate is in an electrically floating state, information can be stored even after the power is switched off.

FIG. 14 is a circuit diagram showing a configuration of an array section of a conventional nonvolatile semiconductor memory device. In FIG. 14, this nonvolatile semiconductor memory device includes two memory arrays MAR and MAL. In the memory array MAR, memory cells MC are disposed in a matrix of rows and columns and also in the memory array MAL, memory cells MC are disposed in a matrix of rows and columns. In the memory array MAR, bit lines BLR are disposed corresponding to respective columns of memory cells MC, while word lines WLR are disposed corresponding to respective rows of memory cells MC. In FIG. 14, there are represented memory cells MC disposed in one row and four columns or bit lines BLR1 to BLR4 corresponding to respective columns and the word line WLR corresponding to the row.

In the memory array MAL, likewise, bit lines BLL (BLL1 to BLL4) are disposed corresponding to respective columns of memory cells MC, while word lines WLL are disposed corresponding to respective rows of memory cells MC. The bit lines BLR and BLL are disposed in a mutually corresponding manner in memory arrays MAL and MAR. Each bit line BLR is provided with a precharge transistor PR (PR1 to PR4) precharging an associated bit line BLR to a prescribed voltage level in response to a precharge instructing signal C1 or C2, while each bit line BLL is provided with a precharge transistor precharging an associated bit line BLL to a prescribed voltage level in response to a precharge instruction signal D1 or D2.

Between the memory arrays MAR and MAL, latch circuits LTH (LTH1 to LTH4) are disposed corresponding to respective pairs of bit lines BLR and BLL. Each of the latch circuits LTH1 and LTH4 includes a pair of cross-coupled P channel MOS (Insulated Gate Field Effect) transistors Q1 and Q2; and a pair of cross-connected N channel MOS transistors Q3 and Q4. The latch circuit LTH (LTH1 to LTH4) performs differential amplification of a signal on a latch node LNR (LNR1 to LNR4) and a signal on a latch node LNL (LNL1 to LNL4), and latch resultant complementary signals. Power supply nodes SP1 and SN1 of each of the odd-numbered latch circuits LTH1 and LTH3 are coupled to receive sense drive signals P1 and N1, while power supply nodes SP2 and SN2 of each of the even-numbered latch circuits LTH2 and LTH4 are coupled to receive sense drive signals P2 and N2.

Between bit lines BLR1 to BLR4 and corresponding latch circuits LTH1 to LTH4, there are disposed transfer gates XR1 to XR4 for connecting the bit lines to the corresponding latch circuits when made conductive. The odd-numbered transfer gates XR1 and XR3 becomes conductive in response to a transfer instructing signal T1, while the even-numbered transfer gates XR2 and XR4 becomes conductive in response to a transfer instructing signal T2.

Further, between bit lines BLL1 to BLL4 and corresponding latch nodes LNL1 to LNL4 of the latch circuits LTH1 to LTH4, there are disposed respective transfer gates XL1 to XL4. The odd-numbered transfer gates XL1 and XL3 becomes conductive in response to the transfer instructing signal T1, while the even-numbered transfer gates XL2 and XL4 becomes conductive in response to the transfer instructing signal T2.

In order to perform programming/erasure verification, there are provided determination transistors DTR1 to DTR4 that become conductive in response to signal potentials on the latch nodes LNR1 to LNR4 and drives a coincidence detection line $2r$ to the ground voltage level when conductive and further, there are provided determination transistors DTL1 to DTL4 that become conductive in response to signal potentials on the latch nodes LNL1 to LNL4 and drives a coincidence detection line $2l$ to the ground voltage level when being conductive. The coincidence detection lines $2r$ and $2l$ are provided with respective current detecting circuits $3r$ and $3l$. The current detecting circuits $3r$ and $3l$ detect whether or not current flows on the respective coincidence detection lines $2r$ and $2l$, and according to detection results, detect whether or not corresponding latch nodes LNRs and LNLs are at the same logic level. Now, description will be made of operations in data read of the nonvolatile semiconductor memory device represented in FIG. 14 with reference to a signal waveform diagram represented in FIG. 15.

It should be noted that in FIG. 15, there are presented signal waveforms of the bit lines BLR1, BLL1, BLR2 and BLL2 when a power supply voltage is 3 V and a word line WLL is selected.

In the standby state, the bit lines BLR (indicating the bit lines BLR1 to BLR4 representatively hereinafter) and BLL (indicating the bit lines BLL1 to BLL4 representatively hereinafter) are at the ground voltage level and further, the word lines WLR and WLL are also at the ground voltage level.

In a programming operation, the precharge instructing signal C1, first, is set to 1V+Vth (pr). Here, Vth (pr) indicates a threshold voltage of the precharge transistor PR (PR1 to PR4). Likewise, the precharge instructing signal D1 is set to 0.5V+Vth (pl). Here, Vth (pl) indicates a threshold voltage of the precharge transistors PL1 to PL4. In a case where 3 V is transmitted to the power supply nodes $1r$ and $1l$, the precharge transistors PR1 and PR3 precharge the bit lines BLR1 and BLR3 to a voltage level of 1 V. On the other hand, the precharge transistors PL1 and PL3 precharge the bit lines BLL1 and BLL3 to a voltage level of 0.5 V.

In parallel to the precharge operation, sense drive signals P1 and N1 are both set to a voltage level of 0.5 V. When the sense drive signals P1 and N1 go to 0.5 V, the latch nodes LNR1, LNL1, LNR3 and LN3 are precharged to a voltage level of 0.5 V since the power supply nodes SP1 and SN1 in the latch circuits LTH1 and LTH3 both go to 0.5 V. After the precharge operation is completed, the word line WLR is driven into the selected state of a voltage of 3 V while keeping the bit lines BLR and BLL in an electrically floating state.

In the bit line BLR1, memory cell MC is put into the on state or the off state according to stored information thereof. When a threshold voltage of the memory cell MC connected to the bit line BLR1 is high, the memory cell MC maintains the off state and the bit line BLR1 maintains the precharge state even if the word line WLR is driven to 3 V. On the other hand, when a threshold voltage of the memory cell MC connected to the bit line BLR1 is low, the memory cell MC connected to the bit line BLR1 is put into the on state, a current flows from the bit line BLR1 to a source node (ground node) through the memory cell MC and a voltage level of the bit line BLR1 decreases to the ground voltage level. Contrast to the bit line BLR1, in the bit line BLR2, no precharge operation is performed, the word line WLL stays in the non-selected state and the bit line BLR2 maintains the ground voltage level.

Word line WLR is driven into the non-selected state, the bit line BLR1 is put into the electrically floating state at a voltage level corresponding to stored information of the memory cell MC. Then, the transfer instruction signal T1 is set to H level of 3 V to place the transfer gate XR1 in the on state. When the transfer gate XR1 is put into the on state, a voltage level of the latch node LNR1 changes according to stored information of the memory cell MC from the precharge voltage of 0.5 V. In parallel to activation of the transfer instruction signal T1, the sense drive signal P1 is driven to the power supply voltage of 3 V and the drive signal N1 is pulled down to the ground voltage level. Responsively, the latch circuit LTH1 performs differential amplification of the voltages on the latch nodes LNR1 and LNL1 and latches resultant signals of the differential amplification.

The latch node LNL1 is at a voltage level of the precharge voltage of 0.5 V. On the other hand, a voltage level of the latch node LNR1 changes from the precharge voltage level according to an electric charge transmitted from the bit line BLR1 and a small difference in voltage between the latch nodes LNL1 and LNR1 is differentially amplified by the latch circuit LTH1. In a case where a threshold voltage of the memory cell MC is high, the latch node LNR1 is driven to a voltage (3 V) higher than the precharge voltage of 0.5 V. On the other hand, in a case where a voltage level of the latch node LNR1 is lower than the precharge voltage of 0.5 V, the latch node LNR1 is driven to the ground voltage level in response to the sense drive signal N1. In this state, the latch circuit LTH1 latches complimentary signals resulting from the differential amplification while maintaining the drive signals P1 and N1 at 3 V and the ground voltage of 0V, respectively.

When transfer and latch operations of a data of a memory cell connected to an odd-numbered bit line are complete, then read-out (transfer latch) on a memory cell of an even-numbered bit line is performed. In this case, the precharge instructing signal C2 is set to a voltage level of 1 V+Vth (pr) and the precharge instructing signal D2 is driven to a voltage level of 0.5 V+Vth (pl). Accordingly, the bit lines BLR2 and BLL2 are precharged to 1 V and 0.5 V, respectively.

When the precharge operation is completed, the word line WLR is again driven to the selected state and when a voltage level of the bit line BLR2 changes according to stored information on a corresponding memory cell MC, the word line WLR is driven to the non-selected state and the bit line BLR2 is driven to the electrically floating state. Then, the transfer instructing signal T2 is driven to H level of 3 V, the transfer gates XR2 and XL2 are put into the on state and the bit lines BLR2 and BLL2 are coupled to the respective latch nodes LNR2 and LNL2 of the latch circuit LTH. The latch node LNL2 maintains the precharge voltage of 0.5 V, while a voltage level of the latch node LNR2 changes from the precharged voltage level according to an electric charge transmitted from the bit line BLR2. After the transfer operation, again, the sense drive signal P2 is driven from 0.5 V to 3 V in voltage level, while the sense drive signal N2 is driven from 0.5 V to the ground voltage level of 0V. Accordingly, the latch circuit LTH2 amplifies and latches a small difference in voltage between the latch nodes LNR2 and LNL2 at a high speed.

After stored information on memory cells are latched in the latch circuits LTHs (indicating latch circuits of LTH1 to LTH4 representatively hereinafter), data of the latch circuits LTHs are sequentially selected and read out in a unit of a prescribed number of bits (1 bit or a plurality of bits) according to a column select signal from a column decoder not represented.

A high speed serial access can be realized by sequentially and selectively outputting latch data of the latch circuits LTH.

The reason why data on memory cells connected to the word line WLR are transferred to the latch circuits in two steps is as follows: The latch circuits LTHs each include a cross-coupled type differential amplifier and in operation, latch nodes are charged and discharged according to the voltage levels of respective sense drive signals. In a case where the number of memory cells connected to one row is large, if latch circuits LTHs operate simultaneously and the sense drive signals P (P1 and P2) and N (N1 and N2) are charged or discharged, a large charging/discharging current (sense currents) flows, instantaneous increase occurs in consumed current, and there is a possibility of causing problems such as occurrence of power supply noise and interconnection line disconnection due to heat generation. Therefore, when latch operations of the latch circuits are controlled so as not to be effected at a time and thereby charge/discharge current in latch circuits LTHs is dispersed over time to eventually decrease an instantaneous current. This applies to the precharge transistors and further, fluctuations in voltage level caused by a leakage current in the floating state after the precharge is stopped. In the following description, in a case where the transfer operation is performed in a plural number of times, for example in two-time transfer operation, the first time transfer operation is referred to as an operation in the first phase and the second time transfer operation is referred to as an operation in the second phase. Memory cells whose data are read out in the first phase and memory cells whose data are read out in the second phase are disposed in a physically alternate manner in the row direction. Likewise, bit lines and latch circuits used in the first phase and bit lines and latch circuits used in the second phase are also disposed in a physically alternative manner in the row direction.

The latch circuits are used for automatic verification effected internally on whether or not programming/erasure operations are normally performed in addition to the purpose of temporarily storing read data.

Now, a state where a threshold voltage of a memory cell is low is defined as an erased state or a state where a data "0" is stored, and a state where a threshold voltage of a memory cell is high is defined as programmed state or a state where a data "1" is stored. An erase operation is simultaneously performed on memory cells connected to a word line WL (WLR and WLL). After the erase operation is completed, data on memory cells connected to the word line WLR are transferred to latch circuits LTHs according to the above described procedure. Since memory cells in the erased state each store a data "0," all the latch nodes LNR are at L levels. Therefore, all the determination transistors DTRs (DTR1 to DTR4) each are in the off state and no current flows on the coincidence detection line $2r$ that has been precharged at a prescribed voltage level. The current detecting circuit $3r$ detects that no current flows on the coincidence detection line $2r$ and thereby, detects that erase of memory cells connected to a selected word line is complete. This applies for the word line WLL of the memory array MAL in a similar manner.

A write verification operation is performed in a similar manner and it is discriminated using latch data of latch circuit LTH whether or not "1" has been written on a selected memory cell. In this case, for example, in a case where data "1" are written on memory cells connected to the word line WLR, it is determined that programming operations on all selected memory cells have been complete when all the corresponding latch nodes LNRs go to "1" (H level). Therefore, in this case, write verification is performed using the current detecting circuit 31. This is because when programming is completed, all the nodes LNL (LNL1 to LNL4) go to "0" (L level) and no current flows on the coincidence detection line 21.

Therefore, when erase operations or programming operations are performed till no current flows on the coincidence detection line $2r$ or $2l$ using latch circuits LTHs, erase and programming operations can automatically be performed in the interior of the memory array.

Further, in the memory array, redundant cells for repairing a defective bit are included. A defective bit line replaced with the redundant circuit is still present in the memory array and in a verification operation, latch circuits connected to the defective bit line perform latch operations, similar to others. Therefore, in this case, determination transistors malfunction under influence of a latch circuit provided for the detective bit line, and a correct verification operation cannot be effected. Further, a memory cell on an unused redundant bit lines does not necessarily operate in a normal way, either. This is because although it is determined whether or not a redundant bit line operates in a normal way after redundancy replacement, no address is assigned on an unused redundant bit line, and it is not determined on whether or not the unused redundant bit line is correctly operated either.

Therefore, the following procedure is performed in order to ensure a correct verification operation while excluding an influence of an unused latch circuit provided for a defective bit line or an unused redundant bit line.

FIG. 16 is a block diagram schematically representing a configuration of peripheral circuitry of latch circuits LTH. In FIG. 16, gate circuits 8 and 9 are provided serially to the latch circuit LTH. The latch nodes LNL and LNR of the latch circuit LTH are connected to a forcibly setting circuit 5 through the gate circuits 8 and 9. The forcibly setting circuit 5 is provided commonly to latch circuits LTHs and the gate circuits 8 and 9 are provided to each of the latch circuits LTHs. The gate circuit 8 becomes conductive under control of the gate control circuit 7 and the gate circuit 9 becomes conductive in response to a select signal from an address decoder 6. The address decoder 6 stores addresses of unused bit lines and drives the unused bit lines sequentially to the selected state. The gate circuits 8 and 9 are provided separately from a column select gate coupled to a column select line transmitting a column select signal from a normal column decoder. Now, description will be made of operations of the circuitry represented in FIG. 16 with reference to a flow chart represented in FIG. 17.

After erase and programming operations are performed, memory cell data for verification are transferred to the latch circuit LTH. Thereafter, the forcibly setting circuit 5 is controlled to output an H level signal from the left side node thereof, and an L level signal from right side node thereof (step S1). Then, an address i of an unused address is set to 1 (step S2). The address decoder 6 decodes the unused address i to set the gate circuit 9 into the conductive state (step S3). Then, the gate control circuit 7 set the corresponding gate circuit 8 to the on state when a decoded result is firmly determined. Thereby, complementary signals from the forcibly setting circuit 5 are transferred to corresponding latch circuit LTH and the latch node LNL is forcibly set to H level, while the latch node LNR is forcibly set to L level (step S5). After the latch signals on the latch nodes LNL and LNR are forcibly set, the gate circuit 8 is set to the off state.

Then, it is determined whether or not the address i reaches the final value Nm (step S7) and when the final unused address has not been selected, the unused address i is incremented by 1 in step S8 and processing from step S3, again, is repeatedly performed. When it is determined, in step S7, that the unused address i has reached the final address Nm, then forced setting of latch signals in latch circuits for unused bit lines (a redundant bit line and a defective bit line) is completed and subsequently, a current detection is performed using the current detecting circuit $3r$ connected to the coincidence detection line $2r$ (step S9). The latch node LNR stays at L level by the forced setting circuit 5 and the determination transistor DTR stays in the off state and no influence is exerted on the current detecting operation. When failure is present and a current flows on the coincidence detection line $2r$ in a detection result in step S9, then a fail processing, that is an erase or programming operation, is repeatedly performed in step S11. When pass is determined in step S9, a pass processing is performed in step S10, wherein necessary operations such as an erase or programming operation for a next row are performed.

FIG. 18 is a signal waveform diagram representing forcibly setting operations for a case of 4 unused addresses present. As represented in FIG. 18, after the unused addresses AD1 to AD4 are sequentially put into the definite state and a corresponding gate circuit 9 is put into the on state by a decode signal from the address decoder 6, a gate signal from the gate control circuit 7 is driven to H level to set the gate circuit 8 into the conductive state. A signal at L level from the forcibly setting circuit 5 is transmitted to the latch nodes LNRs of the latch circuits #1 to #4 specified by the addresses AD 1 to AD4 and the latch nodes LNRs are forcibly set to L level. After the forced setting of voltage levels on the latch nodes of the latch circuits #1 to #4, a determination start signal is activated and a determination is performed on whether or not a current is present on the coincidence detection line by the current detecting circuit.

It should be appreciated that the number of unused addresses is equal to the number of redundant bit lines. A defective bit line is replaced with a redundant bit line and therefore, the sum of the number of defective bit lines and the number of unused, redundant bit lines is equal to the number of redundant bit lines originally provided.

With the forcibly setting circuit, determination on completion of erase/programming operations can be effected in a normal way even in an array configuration repairing of a redundant circuit. In a case of such a redundancy configuration, repairing of a defective bit line can be achieved by replacing with a redundant bit line and a defective bit line is set in the normally non-select state and a corresponding redundant circuit is selected, whereby an influence of the defective bit line can be precluded. In a case where a defect is present in a portion including a latch circuit LTH between transfer gates, however, the defect repairing may not be achieved only by redundancy replacement depending on the state of the defect, leading to a possibility of bringing the whole memory array into a defective state.

Now, a case where short circuit arises between latch circuits having different operating phases, as represented in FIG. 19, will be considered. That is, a case will be considered in which a resistance R exists due to a particle between the latch nodes LNL1 and LNL2 and thereby, the latch nodes LNL1 and LNL2 are short-circuited. In this case, as a signal waveform diagram represented in FIG. 20, a state is here represented in which data transfer/latch operations in the first phase are complete. In this state, the sense drive signals P1 and N1 are at voltage levels of the power supply voltage of 3.0 V and the ground voltage of 0 V, respectively. Further, a state is further considered in which the latch node LNR1 is held at the ground voltage of 0 V and the latch node LNL1 is held at the power supply voltage of 3.0 V.

In the second phase, the sense drive signals P2 and N2 are first driven from the ground voltage level to the voltage level of an intermediate voltage of 0.5 V. In this case, the latch node LNL2 receives the sense drive signal P1 through a resistance element R and a MOS transistor Q1 in the latch circuit LTH1, and a voltage level of the latch node LNL2 is raised higher than 0.5 V of the precharge voltage. When a voltage level of the latch node LNL2 rises, a voltage of the latch node LNL2 is transmitted to the sense drive signal P2 through a MOS transistor Q1 in the latch circuit LTH2 to raise a voltage level of the sense drive signal P2 since the latch circuit LTH2 effects differential amplification of a voltage difference between the latch nodes LNL2 and LNR2. The latch nodes LNL2 and LNR2 are isolated and the latch node LNR2 is held at a voltage level of the sense drive signal N2, namely a voltage level of 0.5 V even when in the latch circuit LTH2, a MOS transistor Q4 has been put into the on state. In this case, the gate and source of a MOS transistor Q3 come to be at the same voltage level and a MOS transistor Q3 maintains the off state. Therefore, the sense drive signal N2 is at a voltage level of 0.5 V.

After this precharge operation, a word line WLR is selected and a memory cell data is read out onto a corresponding bit line. Thereafter, the transfer instructing signal T2 is activated to make the transfer gates XL2 and XR2 conductive. When the transfer instructing signal T2 is activated as represented in FIG. 21, the bit line (BLL) precharged to 0.5 V of the intermediate voltage through the transfer gate XL2 is connected to the latch node LNL2, while the bit line BLR is connected to the latch node LNR2 through the transfer gate XR2.

Therefore, when a voltage level of the sense drive signal P2 is 1 V or higher and a voltage level on the latch node LNL2 is 1 V or higher, the latch node LNL2 decreases its voltage level a little by receiving an electric charge at the intermediate voltage level from the bit line BLL, while the latch node LNR2 changes its voltage by an electric charge corresponding to a stored data on the memory cell on the bit line BLR 2. As shown clearly represented in FIG. 21, however, when the voltage level of the latch node LNL2 is 1 V or higher, the voltage level is equal to or higher than the precharge level of the bit line, the latch node LNL2 is always determined to be at H level regardless of a logical value of the memory cell data, the latch node LNR2 are determined to be at L level and accordingly latch is effected by the latch circuit LTH2.

Further, in a case where a voltage level on the latch node LNL2 is close to that on the latch node LNR2, voltage levels on the latch nodes LNL2 and LNR2 do not change sufficiently, a sensing margin in the latch circuit LTH2 is small and thereby the latch circuit LTH2 malfunctions to latch an incorrect wrong data when an inverted data (a data of "1") is transmitted to the latch node LNR2.

In a case where the latch node LNL1 is held at the ground voltage level, the MOS transistor Q3 of the latch circuit LTH2 is put in the on state even when the latch node LNL2 is precharged to the intermediate voltage of 0.5 V, and a current is supplied from the sense drive signal N2 to suppress decrease in voltage on the latch node LNL2.

Therefore, in a case where short-circuit arises between latch circuits of different operating phases, there arises such a problem that a latch circuit cannot perform a latch operation in a correct way. Especially when, with short-circuit due to the resistance element R, a voltage of the sense drive signal P2 further rises beyond the precharge voltage (0.5) of an intermediate voltage, a sensing operation cannot be performed in a correct way in the second phase since there is a rise in voltage level of the sense drive signal P2 applied to all the latch circuits operating in the second phase, and such a problem, accordingly, occurs that a determining operation as a whole cannot be performed in a correct way.

Further, in a case of an unused latch circuit, a determining operation is effected after voltage levels on a latch nodes are forcibly set to prescribed voltage levels by the forcibly setting circuit 5. In this case, a voltage level of a latch node LNR rises and a determination transistor DTR, is put into the on state in a determining operation even if the latch node LNR is forcibly set to L level by forcibly setting circuit 5 when the latch node LNR has, as represented in FIG. 22, a defect resistance element Z1 coupled to the power supply node. Further, in a case where a latch node LNL has a defect resistance element Z2 coupled to the ground node, the latch node LNL falls to L level after the latch node LNL is forcibly set to H level by the forcibly setting circuit 5 and the latch node LNR, accordingly, is driven to H level by the latch circuit LTH to turn the determination transistor DTR into the on state. Therefore, even in a case where potentials of the latch nodes LNR and LNL are forcibly set by the forcibly setting circuit 5 in order to prevent an influence of an unused latch circuit LTH on a determining operation from occurring, such a problem arises that a normal determination cannot be performed when there is present a defect coupled to the fixed potential, such as the defect resistance element Z1 and Z2.

SUMMARY OF THE INVENTION

It is an object of the present invention to provide a semiconductor memory device capable of performing correct determining operation while suppressing an influence of a short-circuit defect even when the short-circuit defect arises in a latch circuit section.

It is another object of the present invention to provide a semiconductor memory device capable of performing a correct determining operation with reliable repairing on a short-circuit defect.

It is a further object of the present invention to provide a nonvolatile semiconductor memory device capable of performing correct programming/erasure determining operations even when a short circuit arises between latch circuits of different operating phases.

It is a further another object of the present invention to provide a semiconductor memory device capable of performing a correct determining operation even when a fixed defect is present in a latch circuit.

A semiconductor memory device according to a first aspect of the present invention includes reverse current preventing elements provided between power supply nodes of a plurality of latch circuits and corresponding latch drive signal lines.

A semiconductor memory device according to a second aspect of the present invention includes a plurality of latch circuits provided between bit lines so as to be shared by first and second memory arrays. Each of the plurality of latch circuits has first and second latch nodes.

The semiconductor memory device according to the second aspect of the present invention further includes: a first determining circuit for determining whether or not the first latch nodes of the latch circuits are all at a first logic level; a second determining circuit for determining whether or not the second latch nodes of the plurality of latch circuits are all at a second logic level; and a plurality of inverter circuits for inverting latch states of the respective latch circuits. Activation of the first and second determining circuits or enabling of the inverter circuit and the second inverter circuit are performed by a control circuit according to whether or not the first determining circuit is available.

A semiconductor memory device according to a third aspect of the present invention includes: a plurality of latch circuits provided corresponding to bit lines and each for latching a data on a corresponding bit line; a forcibly setting circuit for setting forcibly a latch state of each of latch circuits that are unused in a normal operation, among the plurality of latch circuits; and a determining circuit determining whether or not latch nodes of the latch circuits are at the same first logic level. A forced setting of the latch circuits, the determining circuit is activated under the state where the latch circuits are each forcibly set in a prescribed state.

A semiconductor memory device according to a fourth aspect of the present invention includes: floating gate field effect transistors each driving a corresponding coincidence detection line, in response to signal potentials of corresponding latch nodes of a plurality of latch circuits for latching signals on bit lines, wherein an influence of a latch circuit with a fixed defect on a determining operation is suppressed by adjusting a threshold voltage of the floating gate field effect transistor.

With reverse current preventing elements, even when a short-circuit defect is present between the latch nodes of latch circuits of different operating phases, an electrical floating-up of the precharge voltage of a latch node can be prevented from occurring and an adverse influence on a determining operation can also be suppressed.

Further, with an inverter circuit for changing a latch state of a latch circuit, in a case where a defect is present in the memory arrays and the first determining circuit cannot be used, latch states of latch circuits are inverted by the inverter circuit and a determining operation is performed by the other determining circuit, so that a correct determining operation can be ensured, precluding an influence of the defect on determination of latch states even when a fixed defect is present.

Further, forced setting of states has been effected by the forcibly setting circuit or unused latch circuits are sequentially set to prescribed states in a forced way by the forcibly setting circuit, followed by a determining operation, so that the correct determining operation can be performed while suppressing an influence of the defect in an unused latch circuit, Still further, a determination transistor for to driving a coincidence line includes a floating gate field effect transistor, and the floating gate field effect transistor dedicated to a defective latch circuit is programmed to be normally non-conductive, whereby a correct determining operation can be ensured while suppressing an influence of the defective latch circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
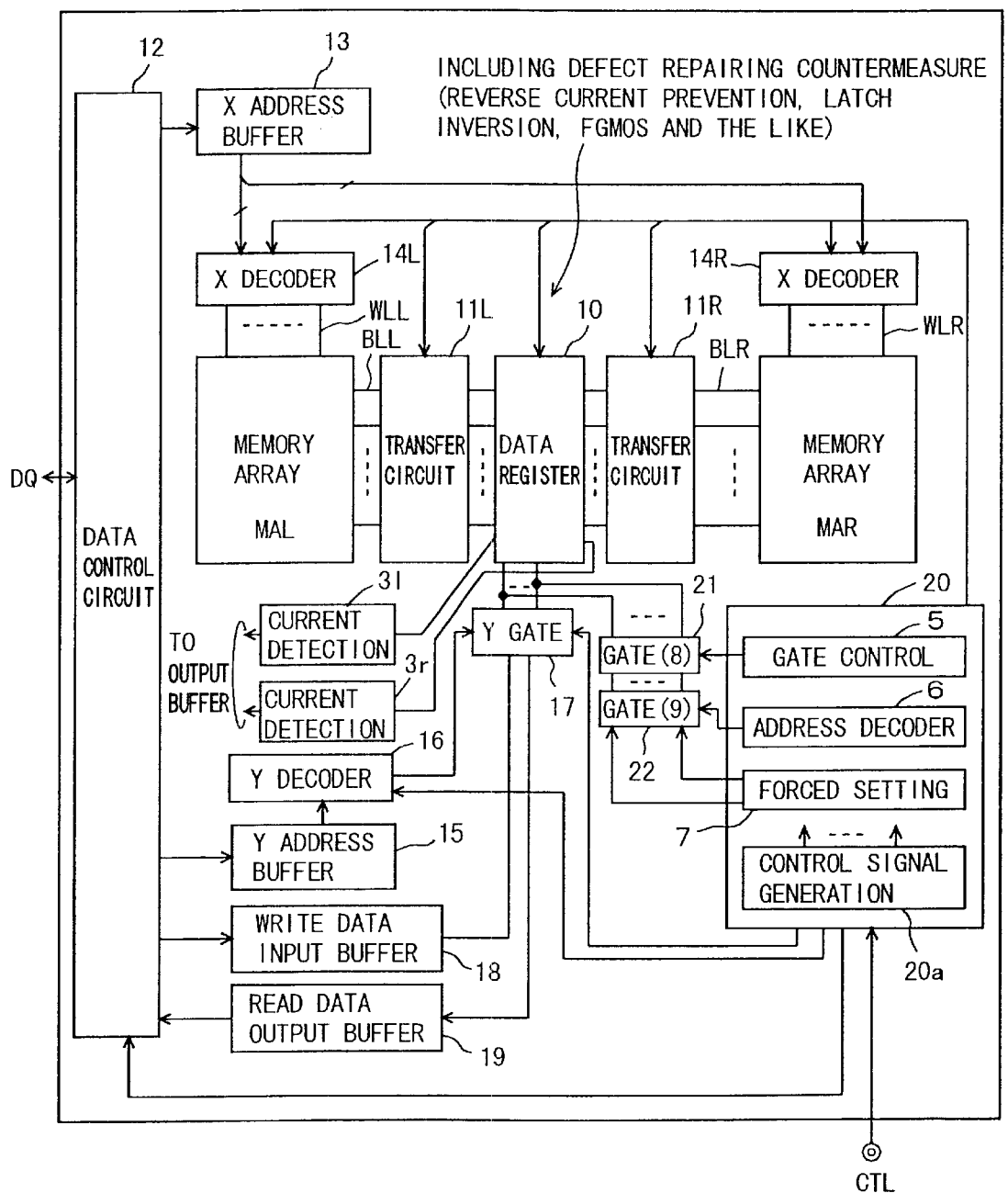
FIG. 1 is a block diagram schematically representing the entire configuration of a semiconductor memory device according to the present invention.

FIG. 1 schematically represents the entire configuration of a semiconductor memory device according to the present invention. In FIG. 1, the semiconductor memory device includes: memory arrays MAL and MAR having a plurality of memory cells disposed in a matrix of rows and columns, word lines disposed corresponding to respective memory cell rows, bit lines disposed corresponding to respective memory cell columns; a data register 10 shared by the memory arrays MAL and MAR and used for latching transfer data; a transfer circuit 11L for coupling the memory array MAL and the data register 10; and a transfer circuit 11R for transferring a data signal between the data register 10 and the memory array MAR.

The transfer circuit 11L includes transfer gates (XL) provided for respective bit lines BLL included in the memory array MAL, while the transfer circuit 11R includes transfer gates (XR) provided for respective bit lines BLR included in the memory array MAR. The data register 10 includes latch circuits (LTH) disposed corresponding to the columns of the memory arrays MAL and MAR and shared therebetween. As is described later, in First Embodiment, the data register 10 includes elements each for preventing a reverse flow of a power supply current in a latch circuit in order to avoid occurrence of a short-circuit defect.

The semiconductor memory device further includes: a data control circuit 12 receiving and transmitting a data DQ and an address signal, not shown, from and to an outside under control of the control circuit 20; an X address buffer 13 receiving an X address from the data control circuit 12 to produce an internal X address; and X decoders 14L and 14R provided corresponding to the memory arrays MAL and MAR, decoding an internal X address from the X address buffer 13, and for driving word lines of the corresponding memory arrays MAL and MAR to a selected state. The X decoder 14L transmits a prescribed voltage to an addressed word line WLL of the memory array MAL according to an operating mode, while the X decoder 14R transmits a prescribed voltage to a word line WLR on an addressed row of the memory array MAR according to an operating mode. Activation/deactivation and a generated voltage level of the X decoders 14L and 14R are controlled by the control circuit 20.

The semiconductor memory device still further includes: a Y address buffer 15 receiving an internal Y address from the data control circuit 12 to produce an internal Y address; a Y decoder 16 decoding the internal Y address from the Y address buffer 15, and producing a column select signal selecting a column of the memory array MAL or MAR; a Y gate 17 coupled with the data register 10, and selecting a latch circuit included in the data register 10 according to a column select signal from the Y decoder 16; a write data input buffer 18 buffering a write data received from the data control circuit 12 to produce an internal write data in a data write operation, and transmitting the internal write data to a corresponding latch circuit included in the data register 10 through the Y gate 17; and a read data output buffer 19 producing an internal read data from a data on a memory cell selected by the Y gate 17 in a data read mode, and applying the internal read data to the data control circuit 12. The Y gate 17 includes column select gates provided corresponding to the respective latch circuits included in the data register 10, and a column select gate corresponding to an addressed column according to a column select signal from the Y decoder 16 becomes conductive.

Current detecting circuits 3l and 3r are provided in order to detect coincidence/non-coincidence of logic levels on latch nodes of the latch circuits included in the data register 10. The current detecting circuits 3l and 3r are activated under control of the control circuit 20 and a signal indicating a detection result is applied to the read data output buffer 19. A signal indicating a programming/erasure verification result is output to the outside from the read data output buffer 19 through the data control circuit 12, whereby an external device monitors whether or not a next operation can be performed. Coincidence results of the current detecting circuits 3l and 3r are fed back to the control circuit 20 and a re-erasure or reprogramming is performed when non-coincidence is detected.

Figure 22:
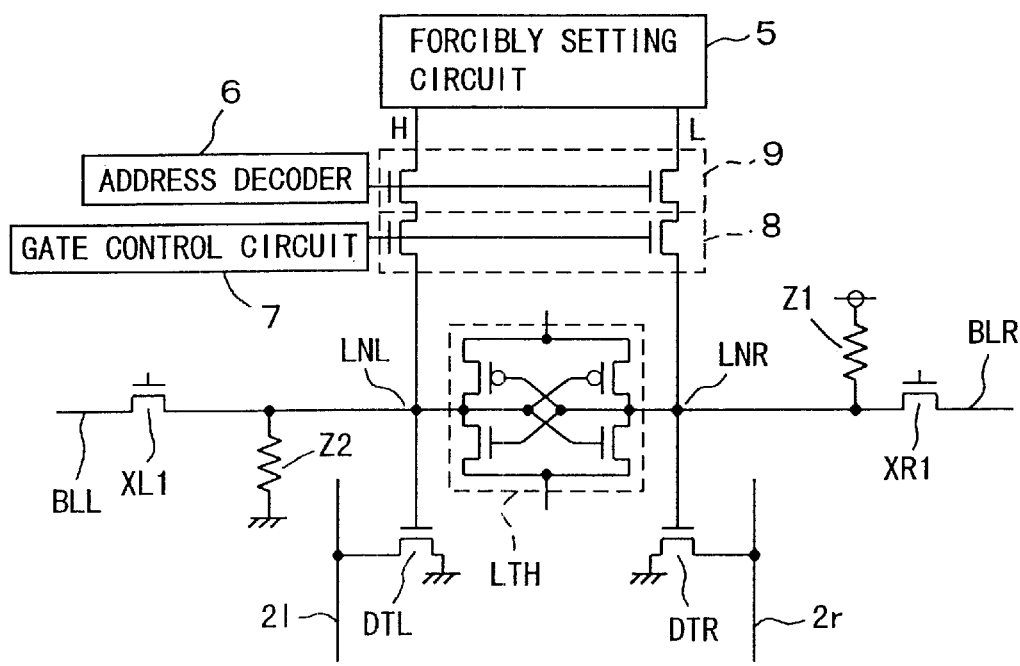
FIG. 22 is a block diagram representing a fixed defect in a conventional semiconductor memory device.

The gates 21 and 22 are provided in order to prevent an influence of an unused latch circuit on a determining operation in a determining operation (a programming/erasure verification operation). The gate 21 includes the gate circuit 8 represented in FIG. 22 and the gate 22 includes the gate circuit 9 represented in FIG. 22. Control of turn-on and turn-off of the gates 21 and 22 is performed by the gate control circuit 5 and the address decoder 6 included in the control circuit 20.

An address to select a redundant column and a defect address to specify a defective bit line are supplied from a not shown register (or a program circuit) to the address decoder 6. The control circuit 20 includes: a forcibly setting circuit 7 for setting a potential on a latch node of a latch circuit included in the data register 10; and a control signal generating circuit 20a generating a signal specifying an operating mode and control signals controlling various kinds of operations according to a control signal CTL and a specific address bit supplied from the outside.

The control signal generating circuit 20a determines which of the rows of the memory arrays MAL and MAR is specified according to the specific address bit and produces various kinds of control signals (a precharge instructing signal, a transfer instructing signal and a sense drive signal) such that a memory cell data is read out onto a bit line of a selected array, while a bit line of a non-selected memory array applies a reference voltage in data latch.

Figure 2:
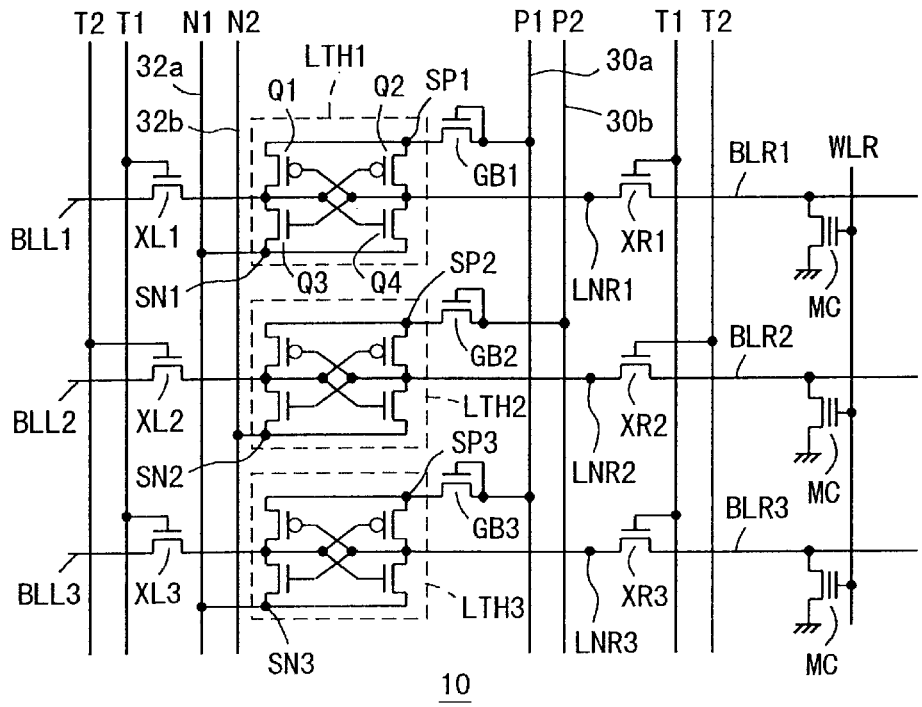
FIG. 2 is a circuit diagram representing a main part of the semiconductor memory device according to a first embodiment of the present invention.

FIG. 2 is a circuit diagram representing a configuration of a main part of the semiconductor memory device according to a first embodiment of the present invention. In FIG. 2, there is representatively represented a portion covering latch circuits LTH1,LTH2 and LTH3 provided corresponding to bit line pairs BLR1 and BLL1, BLR2 and BLL2, and BLR3 and BLL3, respectively. Each of the latch circuits LTH1 to LTH3 includes a pair of cross-coupled P channel MOS transistors Q1 and Q2 and a pair of cross-coupled N channel MOS transistors Q3 and Q4. Reverse current preventing elements GB1 to GB3 are provided to power supply nodes of the respective latch circuits LTH1 to LTH3. The power supply nodes SP1 to SP3 of the latch circuits LTH1 to LTH3 are coupled with a sense drive signal line 30a or 30b through the corresponding reverse current preventing elements GB1 to GB3. In FIG. 2, the power supply nodes SP1 and SP3 of the odd-numbered latch circuits LTH1 and LTH3 are coupled to the sense drive signal line 30a through the respective reverse current preventing elements GB1 and GB3, while the power supply node SP2 of the latch circuit LTH2 is coupled with the sense drive signal line 30b through the reverse current preventing element GB2. The other power supply nodes SN1 to SN3 of the latch circuits LTH1 to LTH3 are coupled with corresponding sense drive signal line 32a or 32b, similar to a conventional case, according to operating phases of the latch circuits LTH1 to LTH3. The other components of the configuration are the same as a conventional device and the same reference numerals are attached to the corresponding components.

Each of the reverse current preventing elements GB1 to GB3 is formed of an N channel MOS transistor having the gate and one conduction node connected together and coupled with the corresponding sense drive signal line 30a or 30b, and the other conduction node coupled with corresponding a sense power supply node (SP1 to SP3). The reverse current preventing element GB (GB1 to GB3) is put into the off state when a voltage level of corresponding power supply node SP (SP1 to SP3) goes higher than a voltage level of a corresponding sense drive signal line 30 (30a or 30b). On the other hand, the reverse current preventing element GB (GB1 to GB3) is put into the on state when a voltage level of corresponding sense power supply node SP is lower than a voltage level of a corresponding sense drive signal line 30 (30a or 30b) and transmits a sense drive signal P (P1 or P2) on the corresponding sense drive signal line to a corresponding power supply node. That is, the reverse current preventing elements GB1 to GB3 each are functionally equivalent to a diode forwardly connected in a direction from a sense drive line to a power supply node and prevents a current from flowing from a power supply node to a sense drive line.

Figure 3:
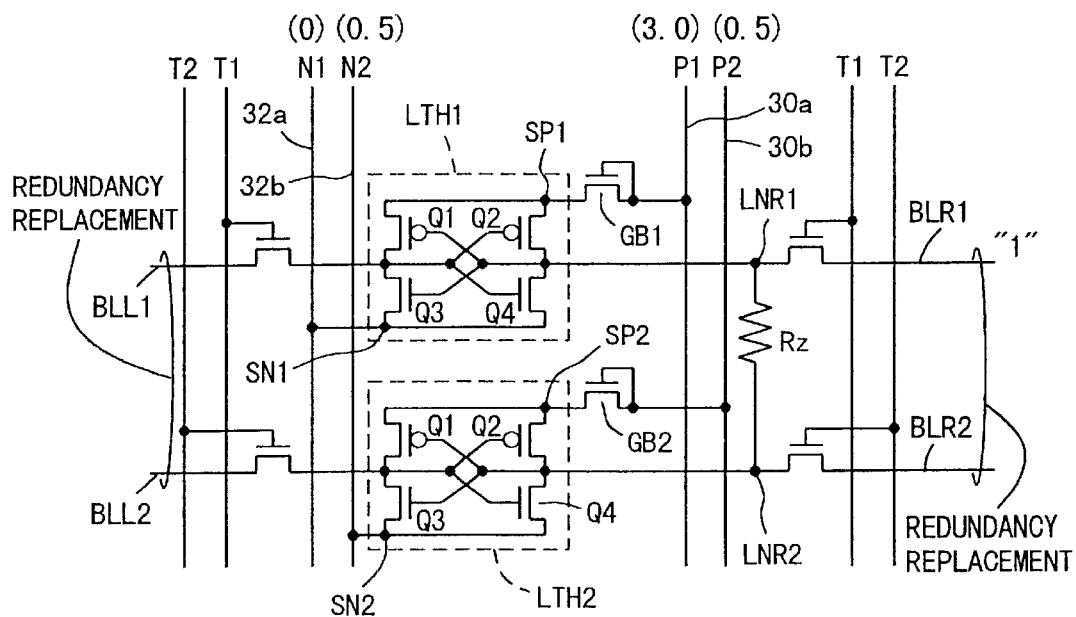
FIG. 3 is a circuit diagram representing a location of a short-circuit defect of the semiconductor memory device according to the first embodiment of the present invention.

Now, a case is considered where as represented in FIG. 3, a resistance Rz due to short circuit is present between the latch nodes LNR1 and LNR2. In this situation, when the first phase in a determining operation is completed, the sense drive signal SP1 is at 3.0 V, while a sense drive signal N1 is at 0 V. When an operation in the second phase is started, the sense drive signals P2 and N2 both are first driven to 0.5 V. A situation will be considered in which a data "1" is read out on the bit line BLR1 and accordingly, the latch node LNR1 is held at H level of 3.0 V. When the latch node LNR2 is raised in voltage level to 0.5 V by the latch circuit LTH2, a voltage level of the latch node LNR2 rises higher than 0.5 V by a current flowing through a short-circuit resistance Rz from the latch node LNRL.

A current is supplied to the latch node LNR2 from the sense drive signal line 30a through the reverse current preventing element GB1, the power supply node SP1, the P channel MOS transistor Q2 and the short-circuit resistance element Rz. When a voltage level of the latch node LNR2 rises, a conductance of the MOS transistor Q3 becomes larger and a voltage of 0.5 V is transmitted to the gate of the P channel MOS transistor Q2 from the sense drive signal N2 in the latch circuit LTH2.

The sense drive signal P2 is transmitted to the power supply node SP2 through the reverse current preventing element GB2 and a voltage level of the node SP2 is 0.5V. Therefore, in the latch circuit LTH2, since a node connected to the latch node LNR2 becomes the source node of the MOS transistor Q2 and a gate potential thereof becomes lower than a source potential, the MOS transistor Q2 is put into the on state and a current is supplied to the power supply node SP2 from the latch node LNR2 through the MOS transistor Q2 to raise a voltage level of the power supply node SP2. In this case, in the reverse current preventing element GB2, a node connected to the power supply node SP2 at the high potential becomes a drain node, a node connected to the sense drive signal 30b at the low potential becomes a source node, and the gate and source are brought to be at the same voltage, so that the reverse current preventing element GB2 is put into the off state. Consequently, the increase in voltage on the power supply node SP2 exerts no adverse influence on a voltage level of the sense drive signal P2. An erroneous determination is effected only in the latch circuit LTH2, and no malfunctions arise in other latch circuits.

The reverse current preventing element GB2 prevents a current in the reverse direction from flowing when a voltage level of the power supply node SP2 is higher than a voltage level of the sense drive signal line 30b.

The bit lines BLR1, BLR2, BLL1 and BLL2 connected to the latch circuits LTH1 and LTH2 are replaced with redundant bit lines, and thereby the failure of the latch circuits LTH1 and LTH2 caused by the short circuit defect (the resistance element Rz) can be repaired to be eliminated. In the other latch circuits that normally operate, transfer/latch operations on data are normally performed and programming/erasure determining operations are performed according to the latch result, whereby correct determining operations are ensured. Similar to a conventional case, nodes of a defective latch circuit are forcibly set in the determining operation.

In a normal operation, since the latch circuits LTH1 and LTH2 are not used (since neither of write and read operations is performed), no adverse influence is exerted. Therefore, a latch circuit section can be repaired in regard to the short circuit defect, thereby enabling a fabrication yield to increase.

Modification

Figure 4:
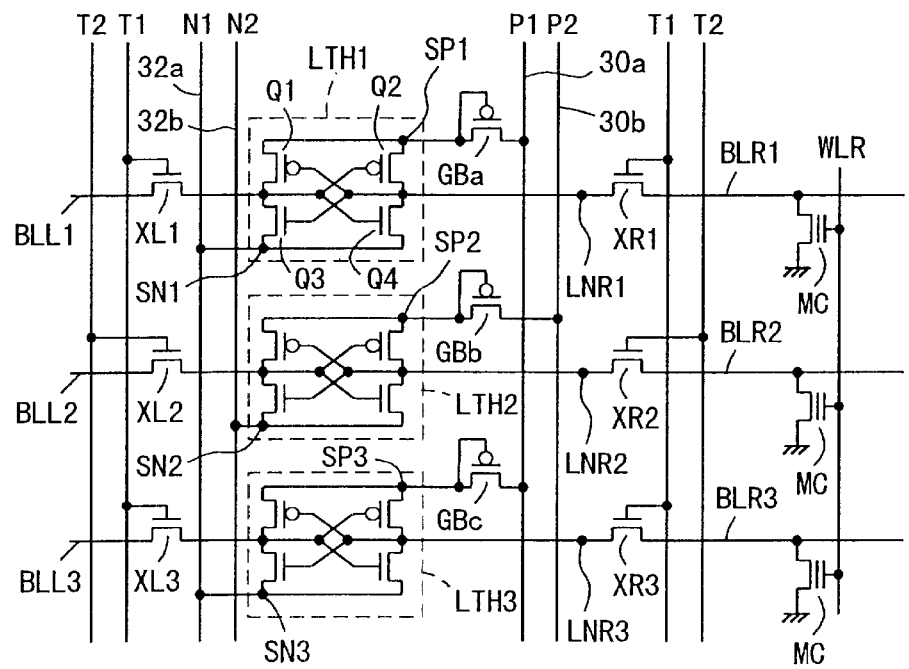
FIG. 4 is a circuit diagram representing a configuration of a modification of the first embodiment of the present invention.

FIG. 4 is a circuit diagram representing a configuration of a modification of the first embodiment of the present invention. In FIG. 4, reverse current preventing elements GBa to GBc formed of respective P channel MOS transistors are disposed at the power supply nodes SP1 to SP3 of the latch circuits LTH1 to LTH3. Since the reverse current preventing elements GBa to GBc are formed of P channel MOS transistors, the respective gates are connected to corresponding power supply nodes SP1 to SP3. Therefore, for example, when a voltage level of the power supply node SP2 rises higher than a voltage level of the sense drive signal P2, the high potential node of the P channel MOS transistor in the reverse current preventing element GBb is a source node, and therefore the gate and source thereof are at the same voltage to put the transistor into the off state. On the other hand, when the sense drive signal P2 becomes higher than a voltage level of the power supply node SP2, a node connected to the sense drive signal line 30b is a source in the P channel MOS transistor and a current is supplied to a corresponding sense power supply node.

Therefore, a similar effect can be attained using the P channel MOS transistor as presented in FIG. 4.

A MOS transistor is used in diode-connection to serve as a reverse current preventing element and thereby, the reverse current preventing element can be fabricated in the same fabrication process as in fabrication of other transistors in the array section, with the result that a reverse current preventing element can be fabricated in a small chip area with ease.

It should be appreciated that when reverse current preventing elements GBs (GB1 to GB3 and GBa to GBc) are adopted, a voltage drop by the absolute value of the threshold voltage occurs in each reverse current preventing element (since a diode-connected MOS transistor is used). Therefore, the sense drive signals P1 and P2 are required to be set higher than in a conventional device by the absolute value of a threshold voltage of each reverse current preventing element. That is, when a latch node is precharged to 0.5 V, the sense drive signals P1 and P2 are required to be set at a voltage level of 0.5 V+Vth, wherein Vth indicates the absolute value of the threshold voltage of the reverse current preventing element. Even when voltage levels of the sense drive signals P1 and P2 in activation of the latch circuits LTH1 to LTH3 are the power supply voltage level of 3.0 V and H level of the latch nodes is 3.0 V−Vth, no problem particularly arises as far as the H level voltage level is the one at which the determination transistor is put into the on state and at which the data read output buffer correctly determines H/L of data, and there is no need to increase the sense drive signals P1 and P2 higher than the power supply voltage.

It should be appreciated that when a short-circuit defect is present, the short-circuit can be harmless by repairing with redundancy replacement. In this case, if there is an extra space in a chip area, a fuse element may be connected serially to a reverse current preventing element, or alternatively a fuse element may be used instead of a reverse current preventing element.

As described above, according to the first embodiment of the present invention, since a reverse current preventive element is provided at the power supply node of a latch circuit latching a data, a leakage current due to the short-circuit defect is prevented from flowing into a sense drive line even in a case where short circuit arises between latch circuits of different phases and accordingly, a correct programming/erasure determining operation can be ensured.

Second Embodiment

Figure 5:
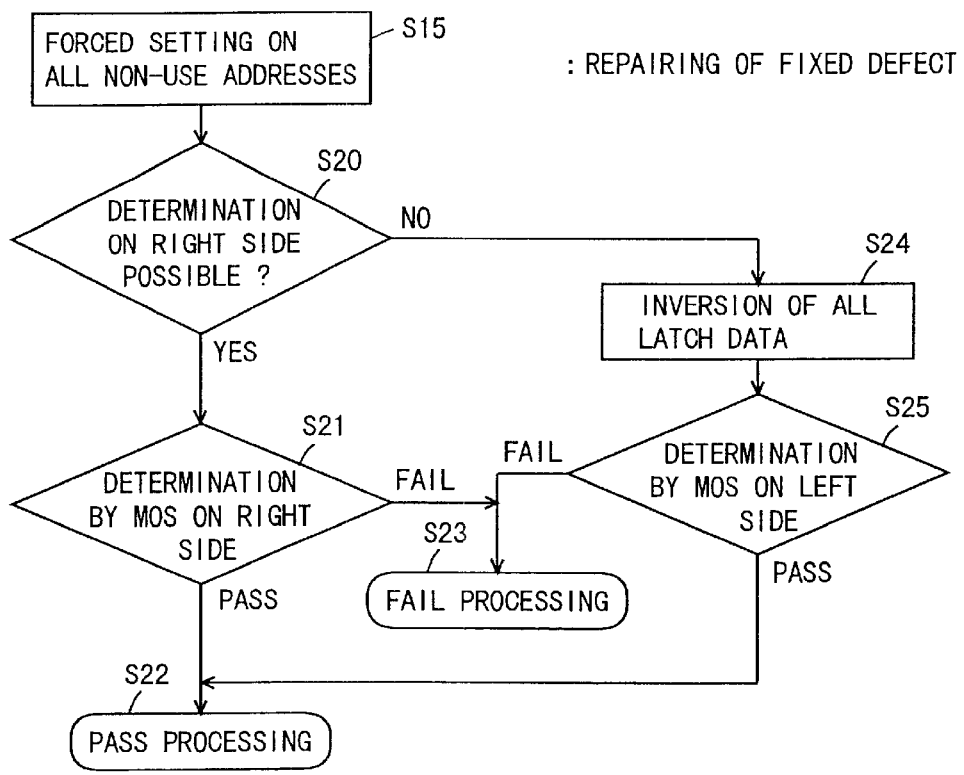
FIG. 5 is a flow chart representing operations of a semiconductor memory device according to a second embodiment of the present invention.

FIG. 5 is a flow chart representing operations of a semiconductor memory device according to a second embodiment of the present invention. In the second embodiment, repairing is effected on a fixed defect that a potential of a latch node is fixed.

Figure 17:
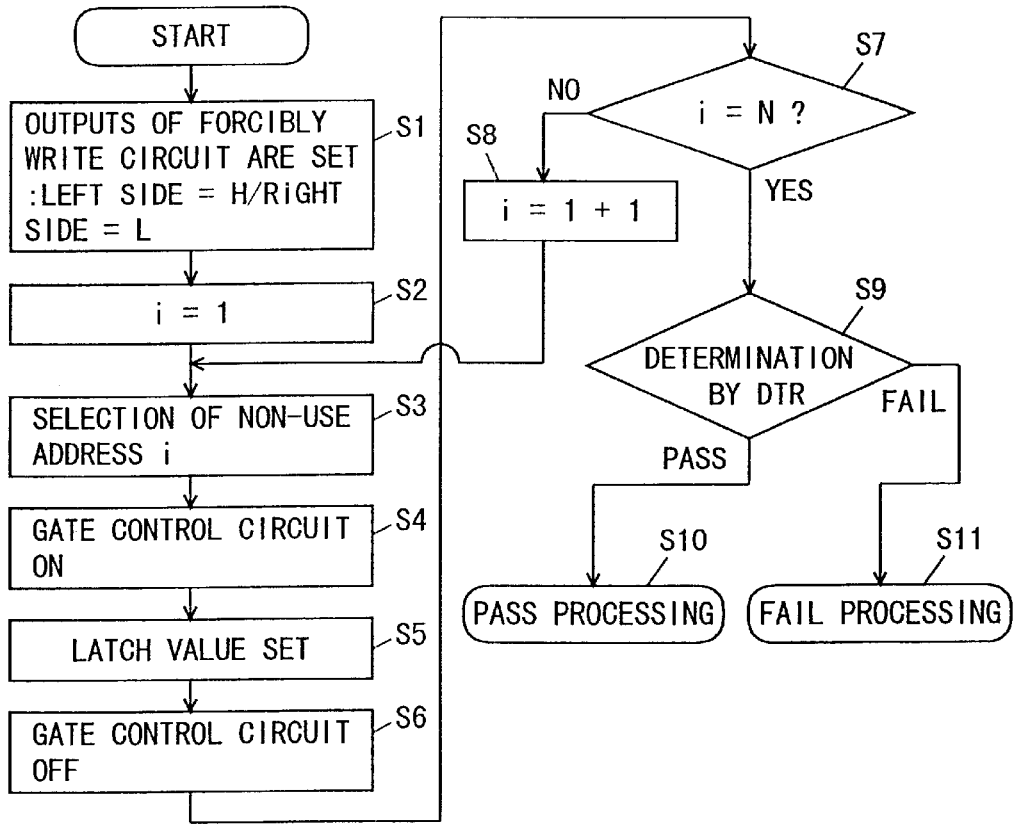
FIG. 17 is a flow chart representing operations of the semiconductor memory device represented in FIG. 16.
Figure 18:
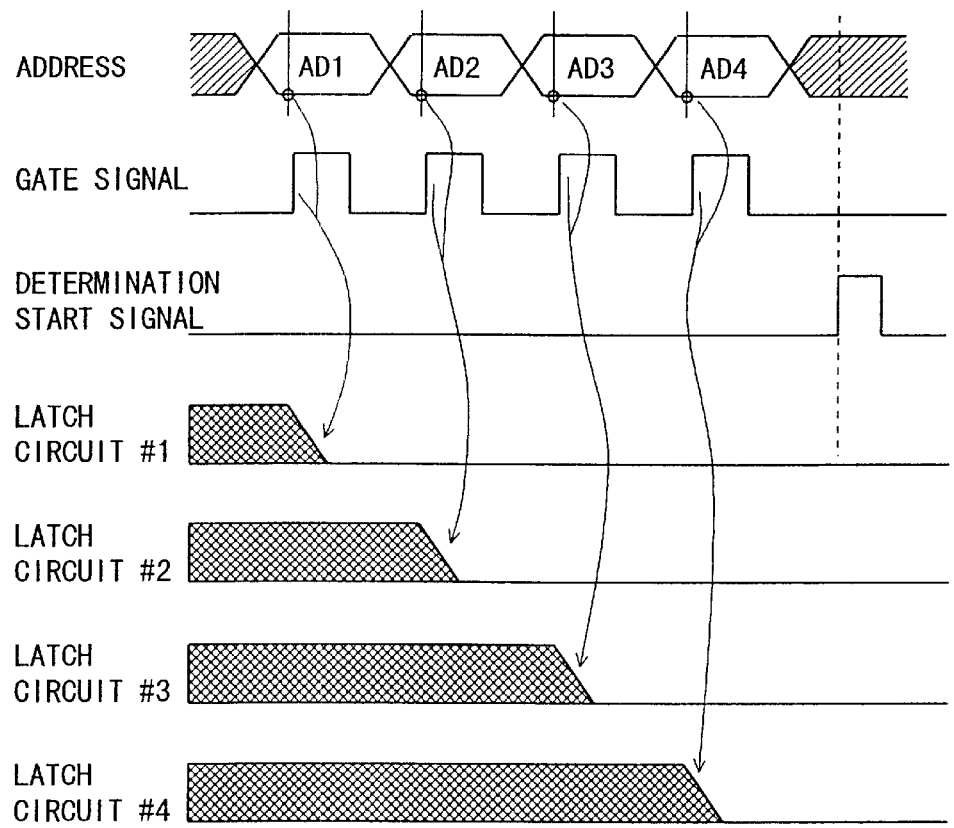
FIG. 18 is a signal waveform diagram representing operations of the semiconductor memory device represented in FIG. 16.
Figure 19:
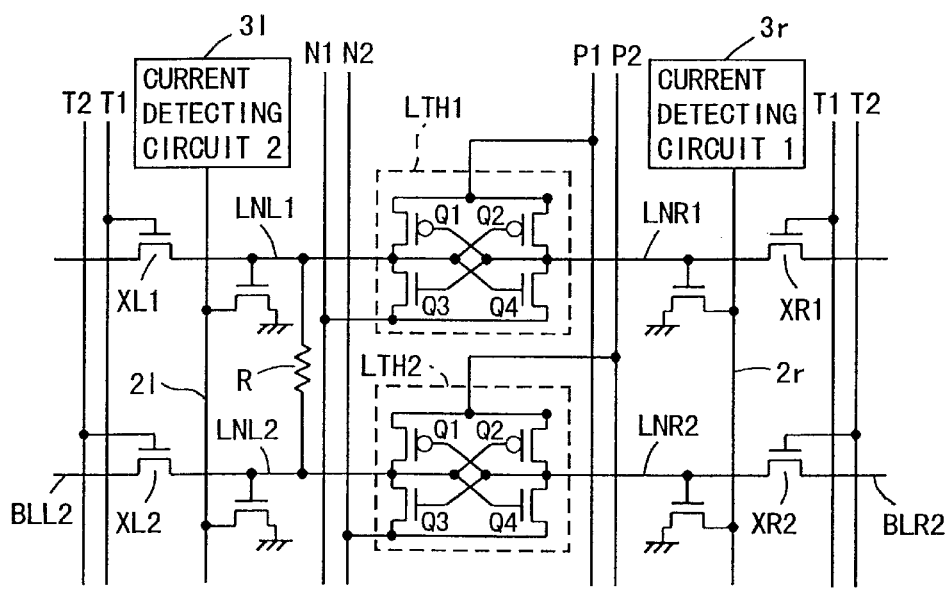
FIG. 19 is a circuit diagram representing a short-circuit defect of a latch circuit in a conventional memory device.
Figure 20:
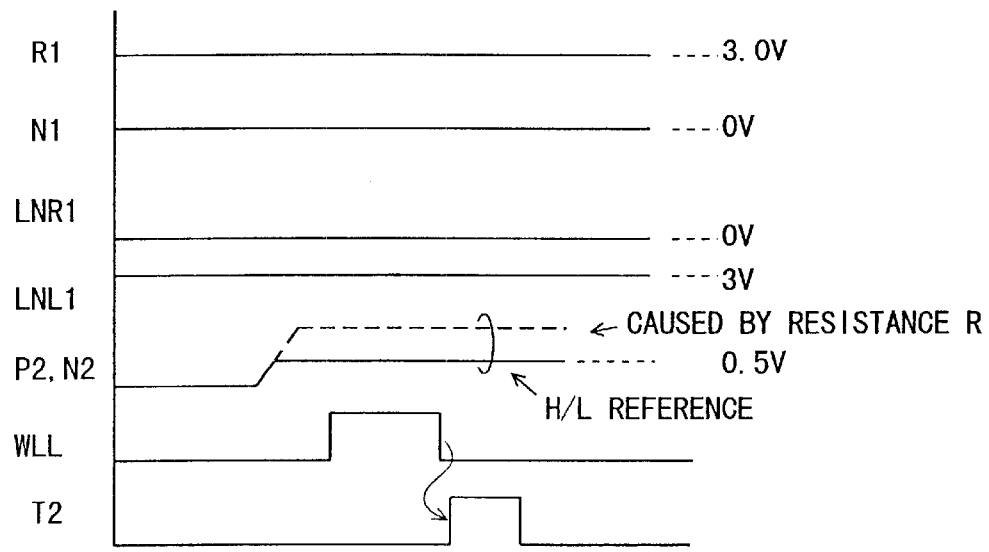
FIG. 20 is a signal waveform diagram representing operations when a short-circuit defect represented in FIG. 19 exists.
Figure 21:
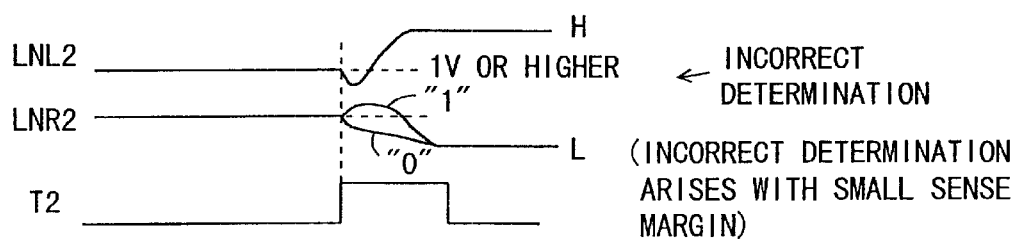
FIG. 21 is a signal waveform diagram representing a potential change of a latch node when a short-circuit defect exists in a conventional semiconductor memory device.

A fail/pass test of a memory cell in a semiconductor memory device is performed in the final stage of the fabrication process in advance. At this time, it is identified which bit has latch data fixed at "1" or "0" at all times. According to such fixed data, the presence or non-presence of a latch circuit whose latch node is fixed to "1" is detected and the information is stored on whether or not a determining operation using a latch node LNR on the right side of the latch circuit can be performed, for example, using a fuse. In a programming/erasure verification operation, the latch nodes LNR of all the latch circuits for a non-use address are all set to "0" by the forcibly setting circuit, similar to a conventional process flow represented in FIG. 17 (step S15).

Then, it is determined whether or not an erasure determining operation using the programmed latch node LNR on the right side can be performed in a test according to information stored previously (step S20). In a case where an erasure determining operation using the latch node LNR on the right side can be performed, the coincidence detection line is driven by determination transistor DTR according to signals latched on the latch nodes LNR on the right side to activate a corresponding current detecting circuit and detect coincidence/non-coincidence (presence or non-presence of a current) (step S21). When a current flows: in a case of fail, a fail processing such as a second erasure operation is successively effected (step S23). On the other hand, when coincidence is detected, a pass processing is effected (step S22), followed by an operation such as an erasure operation on the next row or a programming operation for a new data.

On the other hand, in a case where it is determined, in step S20, according to previously stored information, that a fixed defect of "1" is present on the latch node LNR on the right side, latch data on all the latch circuits LTHs included in the data register are inverted (step S24). In this situation, coincidence/non-coincidence in logic level of the latch nodes LNL is determined, using the determination transistor DTL on the left side (step S25). In a case where latch node LNR is fixed to "1," even when the latch data of all the latch circuits are inverted, a corresponding latch node LNL is fixed to "0". Hence, when a latch state of a latch circuit corresponding to this fixed defect is inverted, the latch state is instantly restored to its original fixed defect state. Therefore, since a fixed defect of the latch node LNL on the left side is "0," and the determination transistor DTL is in the off state, no influence on a determining operation arises.

It should be appreciated that in an erasure operation, when a latch node LNR is fixed to "1," latch data of the latch circuits are inverted. In a programming determination, when a latch node LNR is fixed to "0," latch information on the latch circuits are all inverted and the current detecting circuit on the right side is used. This is because in a programming determining operation, when data on a memory cell is read out onto a latch node LNR, coincidence/non-coincidence in logic level of latch nodes is detected based on presence or non-presence of a current. This will be described later.

Figure 6:
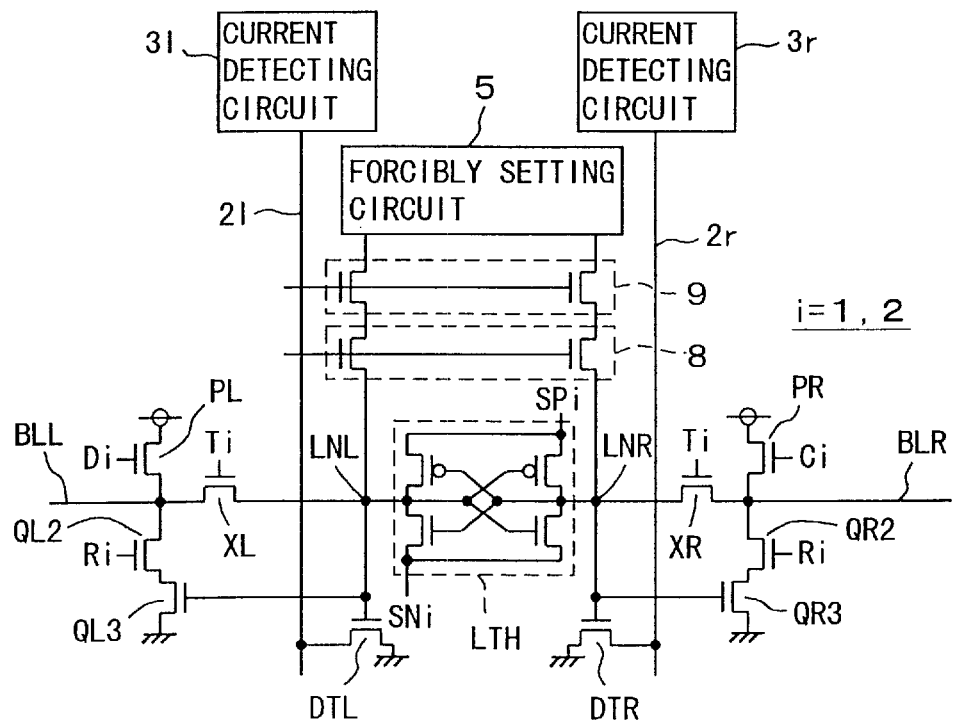
FIG. 6 is a block diagram representing a configuration of a main part of the semiconductor memory device according to the second embodiment of the present invention.
Figure 7:
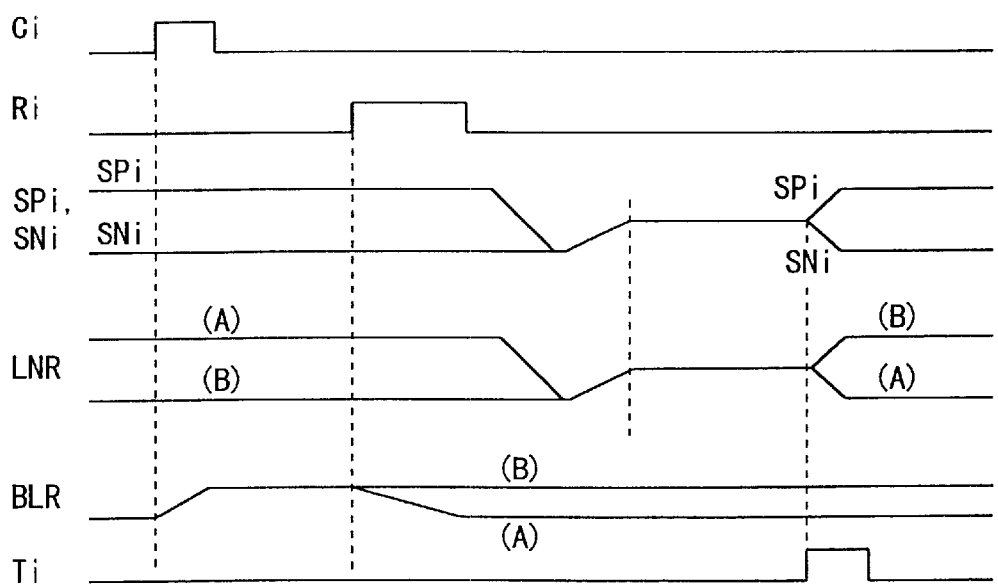
FIG. 7 is a waveform diagram representing operations of a latch data inverter circuit represented in FIG. 6.

FIG. 6 is a block diagram representing a main part of the semiconductor memory device according to the second embodiment of the present invention. In FIG. 6, a configuration of the circuitry related to one latch circuit is represented. In FIG. 6, a latch state inverter circuit includes: an N channel MOS transistor QR2 connected to a bit line BLR and becoming conductive in response to a latch inversion instructing signal Ri; an N channel MOS transistor QR3 connected serially between the MOS transistor QR2 and the ground node, and having a gate thereof connected to the latch node LNR; an N channel MOS transistor QL2 connected to the bit line BLL, and becoming conductive in response to the latch inversion instructing signal Ri; and a MOS transistor QL3 connected serially between the MOS transistor QL2 and the ground node and having a gate thereof is connected to the latch node LNL. The latch circuit LTH has the latch nodes LNR and LNL connected to the bit lines BLR and BLL through the respective transfer gates XR and XL. The precharge transistors PR and PL are provided to the respective bit lines BLR and BLL. Now, description will be made of operations of the inverter circuit represented in FIG. 6 with reference to a signal waveform diagram represented in FIG. 7.

A situation is now considered where the latch circuit LTH is in the latch state and further a latch circuit for a non-use address is also in the latch state forcibly set by the forcibly setting circuit 5 and the gate circuits 8 and 9. More specifically, a situation is considered where the power supply node SPi is at a power supply voltage level of 3.0 V, the power supply node SNi is at the ground voltage level (i=1 or 2) and accordingly, the latch node LNR is in a state where H level is latched((A) state) or L level is latched((B) state).

A precharge instructing signal Ci is set at H level (1.0+ Vth), while the bit line BLR is set at a voltage level of about 1.0 V. At this time, the bit line BLL is also precharged to a voltage level of 1 V by the precharge instructing signal Di. The word line is still in the non-selected state.

Next, the latch inversion instructing signal Ri is set to H level. In a case where the latch node LNR is in the (A) state and maintains at H level, the MOS transistor QR3 is in the on state and the bit line BLR is discharged to the ground potential level. On the other hand, in a case where the latch node LNR is in the (B) state and at L level, the MOS transistor QR3 is in the off state and the bit line BLR maintains the precharged state at 1 V. Similar operations are effected in the bit line BLL as well and an inverted data of latch information on the latch node LNL is produced onto the bit line BLL.

In this situation, an operation of transferring an electric charge on a bit line to the latch circuit is performed. That is, voltage levels of the power supply nodes SPi and SNi are once reduced down to the ground potential level and then raised to a voltage level of 0.5 V. With this change in voltage level, voltage levels of the latch nodes LNL and LNR are precharged to intermediate voltage levels of the respective bit lines BLR and BLL.

Then, the sense power supply node SPi is raised to a voltage level of 3.0 V, while the power supply node SNi is driven down to the ground voltage level. In parallel to this operation, a transfer instruction signal Ti is activated to make the transfer gates XR and XL put into the on states and transmit electric charges on the bit lines BLR and BLL onto the respective latch nodes LNR and LNL. Voltage levels of the power supply nodes SPi and SNi of the latch circuit LTH change and the latch nodes LNR and LNL are driven to logic levels corresponding to the voltages of the power supply nodes SPi and SNi. Data inverted in logic level with respect to the original latch data on the respective latch nodes LNR and LNL are produced on the bit lines BLR and BLL and therefore, the latch data of the latch nodes LNR and LNL of the latch circuit LTH are inverted. When such a series of operations is performed according to operating phases, latch information on all the latch circuits can be inverted. For example, if the latch node LNR is fixed to "1," the latch node LNL is fixed to the "0" level. In this case, by inverting a latch state of a normal latch circuit LTH, a latch data on the latch node LNR is transmitted to the latch node LNL and therefore, when presence or non-presence of current on the coincidence detection line 21 is detected using the current detecting circuit 31, an erasure verification of the selected memory array MAR (a memory array including the bit line BLR) can be performed.

In a programming/verification operation, when programming verification on a memory cell connected to the bit line BLR is performed, the latch node LNR corresponding to a normally programmed memory cell is set to the "1" level. When no fixed detect is present, programming verification is performed using the current detecting circuit 31. The latch node LNL stays in a state where "0" is held and the presence or non-presence of a current on the coincidence detection line 21 is determined by on/off of the determination transistor DTL. Accordingly, when the latch node LNR is of a "0" fixed defect, the latch states are all inverted, similar to the operation as described above, and the current detecting circuit 3r is used instead of the current detecting circuit 3l. With such a procedure, a correct programming verification can be performed even in the "0" fixed defect.

Figure 8:
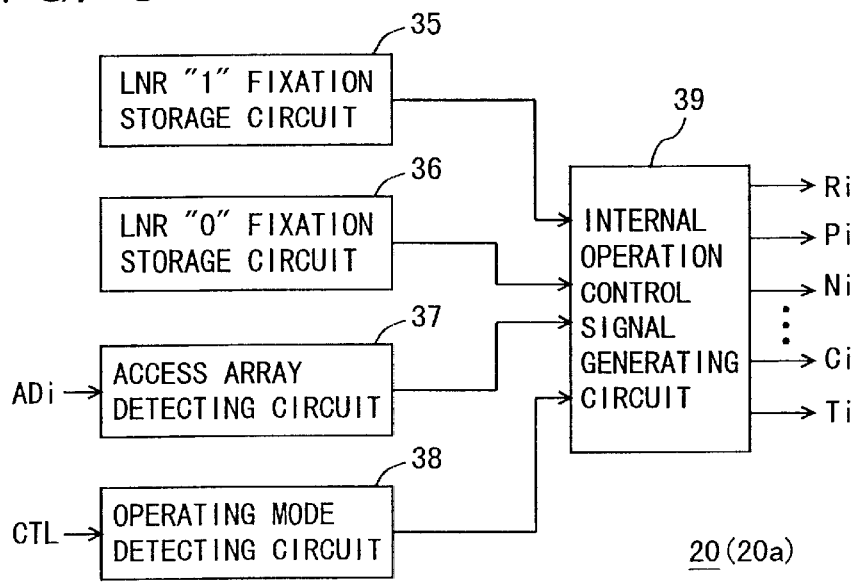
FIG. 8 is a block diagram schematically representing a configuration of a control circuit in the second embodiment of the present invention.

FIG. 8 is a block diagram schematically representing a configuration of a control circuit according to the present invention. A control circuit represented in FIG. 8 corresponds to the control signal generating circuit 20a of the control circuit 20. In FIG. 8, the control circuit 20 includes: a LNR "1" fixation storage circuit 35 storing information on whether or not at least one latch node having the "1" fixed defect is present in latch nodes LNR corresponding to the coincidence detection line 2r; a LNR "0" fixation storage circuit 36 storing information on whether or not at least one latch node having the "0" fixed defect is present in latch nodes LNRs; an access array detecting circuit 37 detecting which memory array, MAR or MAL, is accessed according to a specific address bit ADi; an operating mode detecting circuit 38 detecting an operating mode specified according to a control signal CTL from an outside; and an internal operation control signal generating circuit 39 generating an internal operation control signal according to a signal from each of the circuit 35 to 38. The internal operation control signal generating circuit 39 generates a latch inversion instructing signal Ri, sense drive signals Pi and Ni, a precharge instructing signals Ci and Di, a transfer instructing signal Ti and the like.

The LNR "1" fixation storage circuit 35 stores information, for example, by blowing a fuse element, to produce a signal activated when at least one latch node of the latch nodes LNR corresponding to the coincidence detection line 2r is of a "1" fixed defect. The LNR "0" fixation storage circuit 36 is programmed, for example, by blowing a fuse element, so as to produce a signal that is activated when at least one latch node of the latch nodes LNR corresponding to the coincidence detection line 2r has a "0" fixed defect. With the storage circuits 35 and 36, there are information pieces are simultaneously stored that the "0" fixed defect and/or the "1" fixed defect are present in the latch node or nodes LNL. In other words, the LNR "1" fixation storage circuit 35 simultaneously stores information on the presence of a "0" fixed defect on a latch node LNL and further, the LNR "0" fixation storage circuit 36 simultaneously stores information on the presence of a "1" fixed defect on a latch node LNL.

Figure 9:
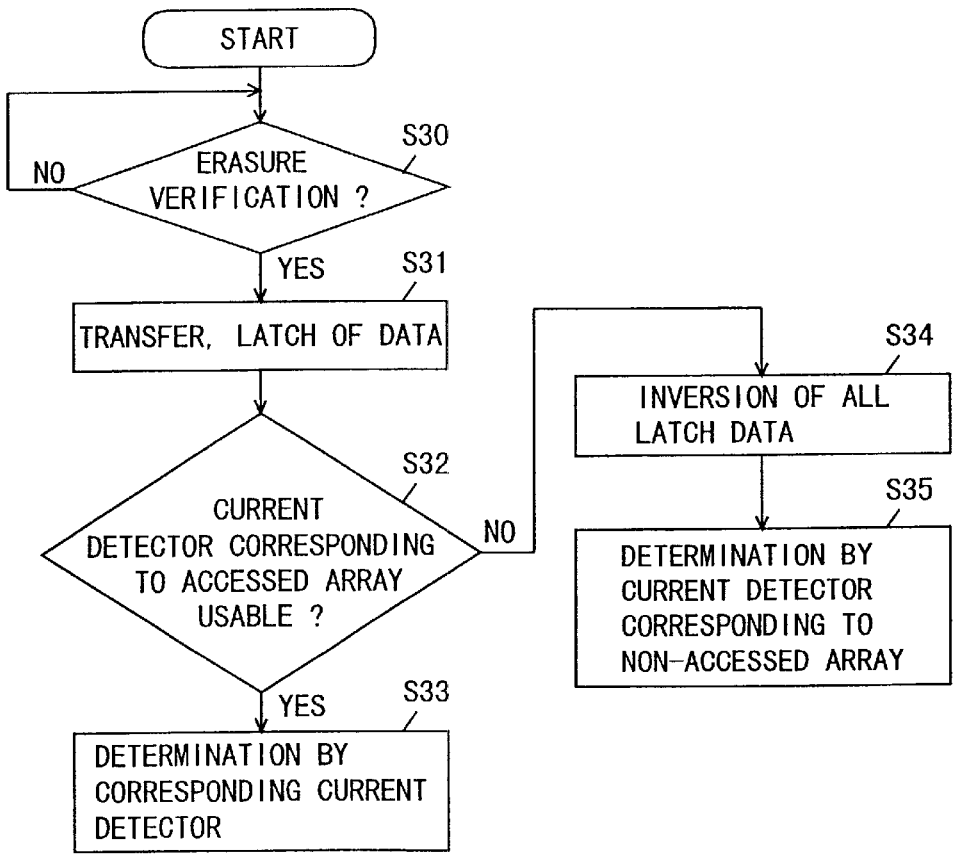
FIG. 9 is a flow chart representing operations of the control circuit represented in FIG. 8.

The access array detecting circuit 37 detects whether a selected word line is present in the memory array MAR or in the memory array MAL and produces an array specifying signal specifying the memory array including the selected word line based on an address bit ADi. The mode detecting circuit 38 detects which of a data read mode, a data erase mode and a data write mode is specified according to a control signal CTL. In the data write mode, erasure and programming are both performed. Now, descriptions will be made of operations in erasure verification of the internal operation control signal generating circuit 39 represented in FIG. 8 with reference to a flow chart represented in FIG. 9.

It is first detected whether or not it is necessary to perform erasure verification (step S30). This is determined simply by detecting whether or not an erasure operation of one time is completed. In a case where it is necessary to perform an erasure verification operation, data on a memory cell in a selected memory array on which erasure has been performed is then transferred to the latch circuit to be latched (step S31). At this time, the latch nodes LNR of a latch circuit for a non-use address are also forcibly set to "0."

Then, the internal operation control signal generating circuit 39 determines whether or not a current detector provided corresponding to an accessed array can be used using the storage circuits 35 and 36 (step S32). For example, when the memory array MAR includes a selected memory cell, it is detected whether or not a "1" fixed defect is present in a latch node LNR with reference to stored data of the LNR "1" fixation storage circuit 35. When it is determined that no "1" fixed defect is present in latch nodes corresponding to the accessed array and a corresponding current detector can be used, then it is determined whether or not erasure has been performed on all the memory cells by activating the corresponding current detector (step S33). Following a result in this determination, necessary successive processings are performed.

In step S32, on the other hand, when it is determined that a "1" fixed defect is present on a latch node corresponding to the accessed array, the internal operation control signal generating circuit 39 generates an internal operation control signal so as to invert all the latched data on the latch circuits LTH (step S34). When inverting operations on all the latched data are completed, then it is determined whether or not erasure is completed using the current detecting circuit provided corresponding to a non-accessed array (step S35). The internal operation control signal generating circuit 39 is operated so as to realize this operating flow and perform adjustments of voltage levels and activation timing of internal operating control signals.

It should be appreciated that in programming verification, the employed storage circuit is an opposed one to that in erasure verification and further, the employed current detector is an opposed one to that in in erasure verification. For example, in a case where programming verification is performed on a selected memory cell of memory array MAR, it is determined whether or not a "0" fixed defect is present in the latch nodes LNR. When a "0" fixed defect is present, all the latch data are inverted and the current detecting circuit 3r is used instead of the current detecting circuit 3l to perform a determining operation.

As described above, according to the second embodiment of the present invention, in a case where there is present a fixed defect causing a malfunction in a verification operation, since the latch data are inverted and the current detecting circuit in use is exchanged, a verification operation can be correctly performed precluding an influence of a fixed defect even when the fixed defect is present. Further, repairing can be effected on the fixed defect, thereby enabling fabrication yield to increase.

It should be appreciated that a bit line corresponding to a latch circuit with the fixed defect has been replaced with a redundant bit line and is not used in a normal access.

Third Embodiment

Figure 10:
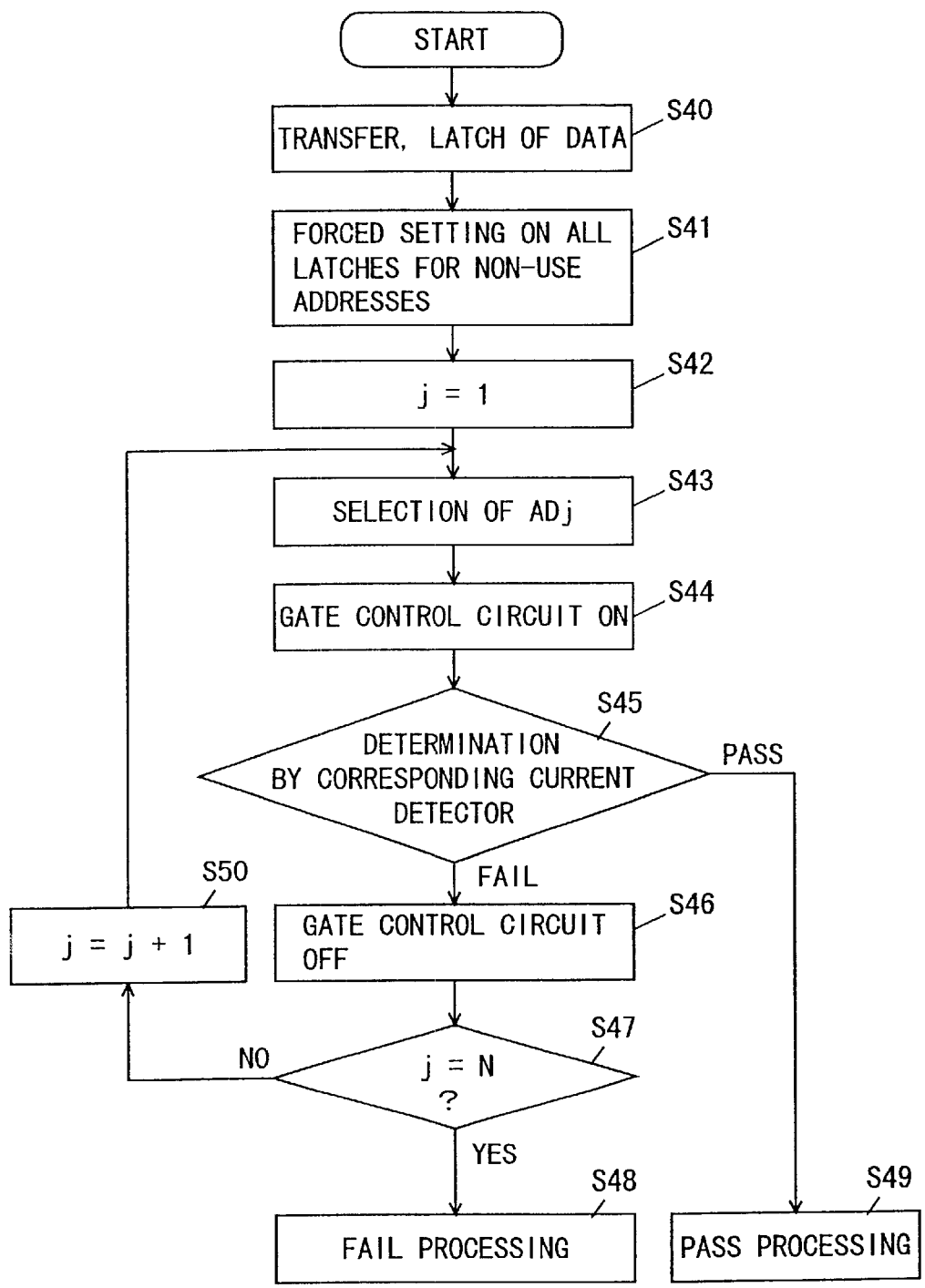
FIG. 10 is a flow chart representing operations of a semiconductor memory device according to a third embodiment of the present invention.

FIG. 10 is a flow chart representing operations in verification of a semiconductor memory device according to a third embodiment of the present invention. Description will now be made of operations in verification of a semiconductor memory device according to the third embodiment of the present invention with reference to FIG. 10.

After erasure or programming is first performed, data on memory cells on a selected row are transferred to and latched on corresponding latch circuits (step S40). Then, potentials of latch nodes for non-use addresses are sequentially set to a predetermined voltage level corresponding to a programming/erasure mode in a forced manner using the forcibly setting circuit, the gate control circuit and the address decoder (step S41). The forcibly setting operation performed in the step S41 is the same as the conventional forcibly setting operation for a voltage level of latch nodes of a latch circuit with a non-use address represented in FIG. 17 and the latch circuits for a non-use addresses are sequentially selected and latch nodes of the latch circuits are forcibly set by the forcibly setting circuit.

Then, a non-use address is set to a starting non-use address (j=i) (step S42). Thereafter, an address ADj is selected and a corresponding gate circuit is put into the on state (step S43). Then, an output signal of the gate control circuit is activated to make a corresponding gate circuit 21 (8) conductive and an output signal of the forcibly setting circuit is transmitted to latch nodes of a corresponding latch circuit through the gate circuit selected with the address ADj (step S44).

Then, in the forced, set state, a current detection determination start signal is activated and it is determined whether or not a current flows on the coincidence detection line using the corresponding current detector (step S45). In the determining operation, latch nodes of a latch circuit corresponding to the address ADj has forcibly been set by the forcibly setting circuit and a voltage level of the latch nodes are fixedly held. Therefore, even when a fixed defect of "0" or "1" is present at the address ADj, a determining operation can be performed precluding an influence of the fixed defect. When a coincidence is detected in step S45, a pass processing as the next processing is performed. (step S49).

On the other hand, when no coincidence is detected in step S45, the gate control circuit is first set in the off state (an output signal of the gate control circuit is set in the inactive state) to make the gate circuit 8 non-conductive, and a latch circuit for an address ADj is isolated from the forcibly setting circuit (step S46). Then, it is determined whether or not the address ADj is the largest among the non-use addresses (step S47). When a determining operation on the final address is not performed with voltage levels of latch nodes of a latch circuit fixed the non-use address is incremented by 1 (setting j=j+1) (step S50) and processing from step S43 is again repeated. In step S47, on the other hand, when determination is performed on the final non-use address, processing is completed for coincidence detection performed on latch circuits for non-use addresses and latch nodes for used addresses, and a fail processing is performed (step S48). In other words, in step S48, a programming operation or an erasure operation is repeatedly performed, again followed by a verification operation for the preceding operation.

Latch nodes of the latch circuits each with a non-use address are sequentially set to the prescribed voltage level and verification operations are performed. Accordingly, when only one of the non-use addresses has a fixed defect, latch nodes of the latch circuit having the fixed defect are subject to forced setting and thereby a correct determining operation can be performed and repairing can be effected on a fixed defect of 1 bit.

Figure 11:
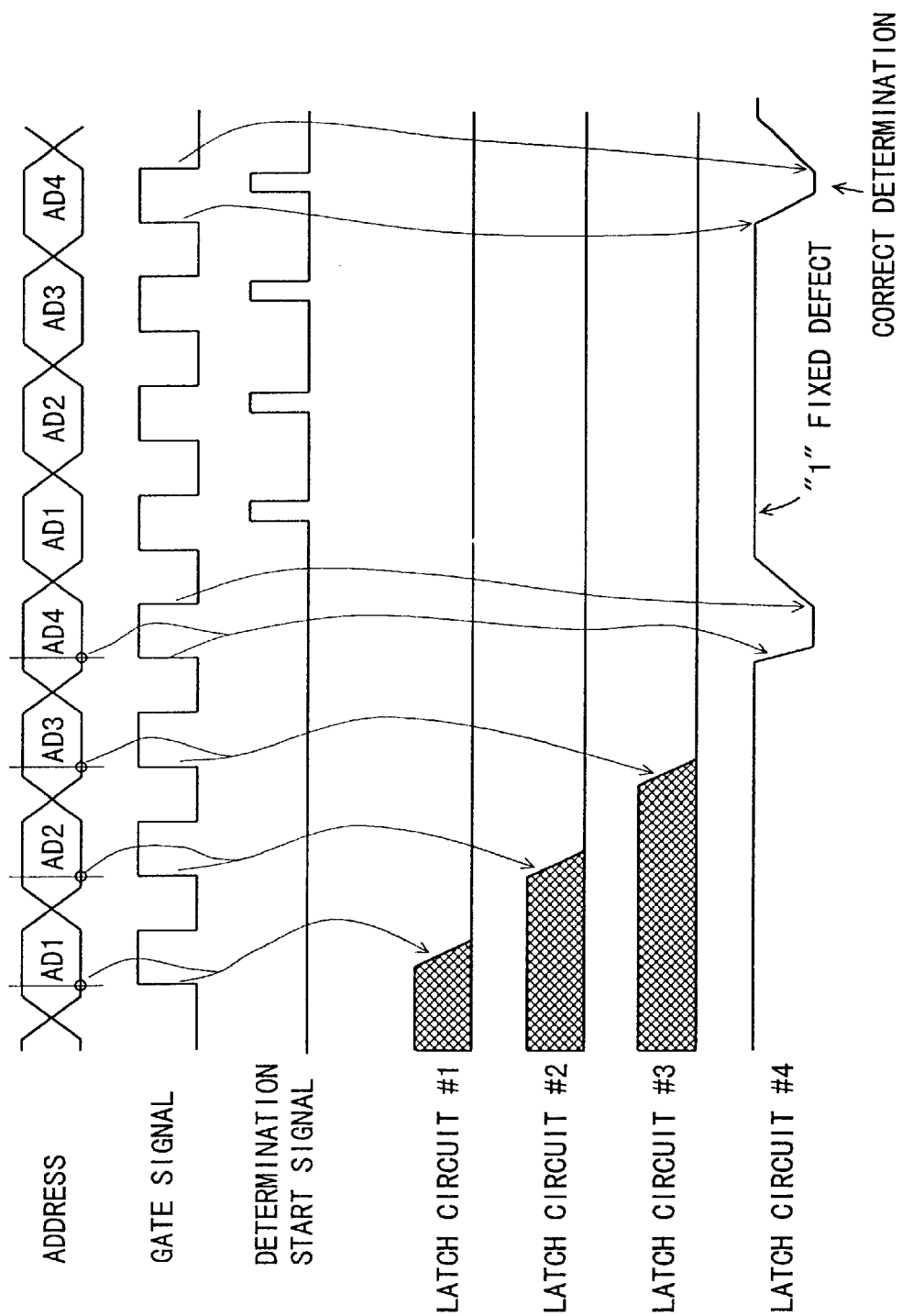
FIG. 11 is a signal waveform diagram representing determining operations of the third embodiment of the present invention.

FIG. 11 is a signal waveform diagram representing determining operations in a case where there are four non-use addresses. In FIG. 11, the addresses ADi to AD4 are sequentially selected, forcibly setting signals from the forcibly setting circuit are transmitted to respective latch circuits #1 to #4 according to gate signals and voltage levels of the latch circuits #1 to #4 are forcibly set by output signals of the forcibly setting circuit. Then, in a case where a latch node of the latch circuit #4 is of a "1" fixed defect, the latch node of the latch circuit #4 is set to a prescribed voltage (L level in FIG. 11) only when a gate signal is activated and an output voltage from the forcibly setting circuit is transmitted to the latch circuit #4, whereas the latch node of the latch circuit #4 is at a voltage level of "1" (H level) due to fixed defect, in the other time period. Therefore, when the addresses AD1 to AD4 are again sequentially selected after the forced setting and the current detecting circuit is activated by a determination start signal, the voltage level of the latch node of the #4 latch circuit is the inverse of voltage levels of the latch nodes of the other latch circuits #1 to #3 and no coincidence is detected. When the address AD4 is selected and a latch node of the latch circuit #4 is set to the prescribed voltage of L level, the latch nodes of the latch circuits #1 to #4 are all set to the voltage level of L level, thereby enabling a correct determining operation to be performed without any influence of fixed defect.

In FIG. 11, a signal waveform in erasure verification is represented, and in programming verification, forcibly set voltage levels of latch nodes of the latch circuits #1 to #4 are "1" (H level). Therefore, in this case, repairing can be performed on a "0" fixed defect of one bit.

As described above, according to the third embodiment of the present invention, latch circuits for non-use addresses are subject to forced setting and thereafter, in a determining operation, latch nodes of latch circuits are sequentially set in a forced manner. In a case where a one bit fixed defect is present, a correct determining operation can be performed when the one bit defect is subject to forced setting, thereby enabling repairing on a one bit fixation defect.

Fourth Embodiment

Figure 12:
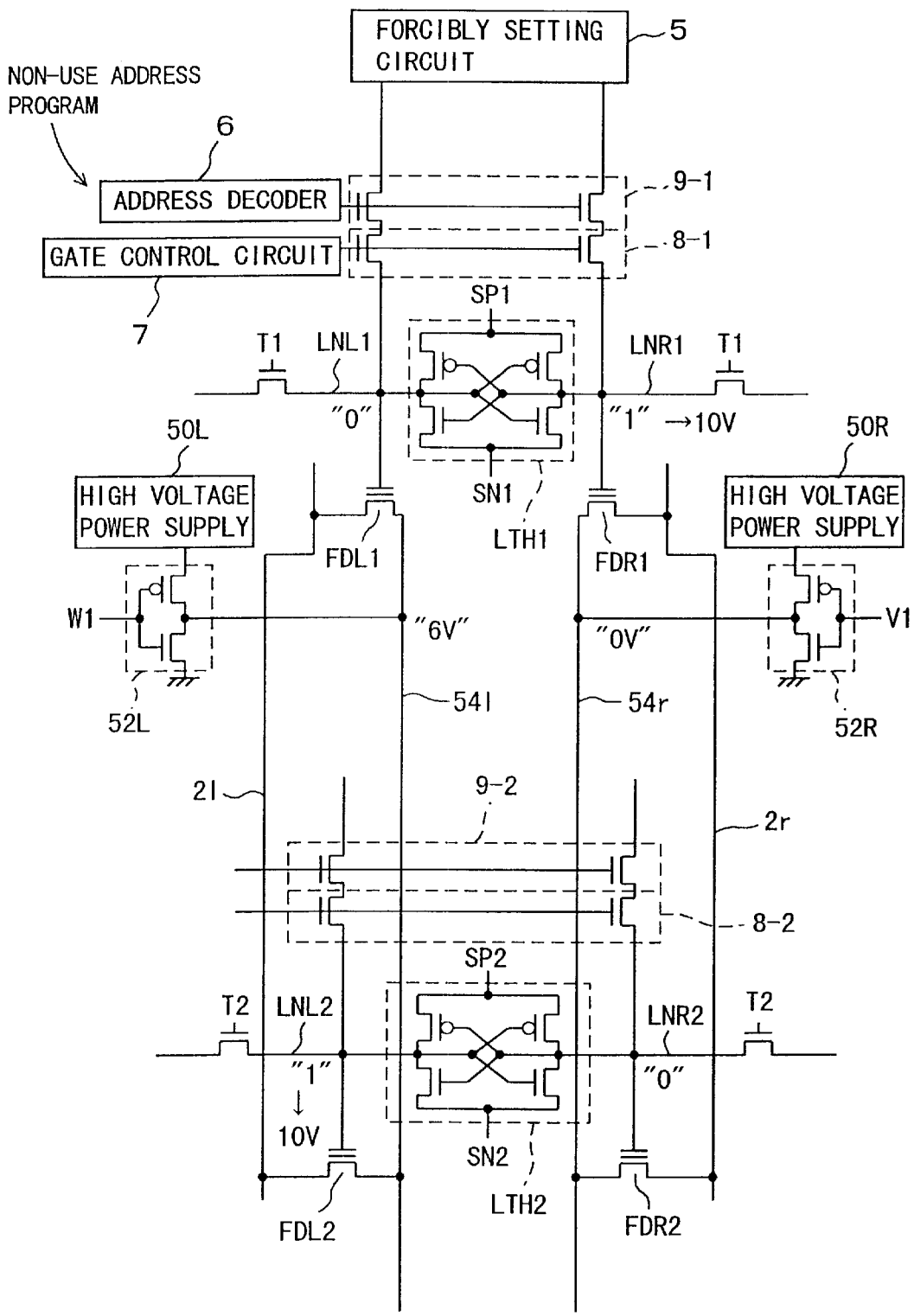
FIG. 12 is a block diagram representing a configuration of a main part of a semiconductor memory device according to a fourth embodiment of the present invention.

FIG. 12 is a block diagram representing a configuration of a main part of semiconductor memory device according to a fourth embodiment of the present invention. FIG. 12, represents a configuration of a portion associated with the latch circuits LTH1 and LTH2. The latch nodes LNR1 and LNL1 of the latch circuit LTH1 are coupled with the forcibly setting circuit 5 through the gate circuits 8-1 and 9-1. On the other hand, the latch nodes LNR2 and LNL2 of the latch circuit LTH2 are coupled with the forcibly setting circuit 5 through the gate circuits 8-2 and 9-2. The gate control circuit 7 sets the gate circuits 8-1 and 8-2 simultaneously in the conductive state, while the address decoder 6 sets a gate circuit corresponding to an addressed latch circuit, among the gate circuits 9-1 and 9-2, to be in the conductive state. Floating gate field effect transistors FDR1 and FDL1 are coupled to the respective latch nodes LNR1 and LNL1, while floating gate field effect transistors FDR2 and FDL2 are coupled to the respective latch nodes LNR2 and LNL2. The sources of the floating gate field effect transistors FDR1 and FDR2 are coupled commonly with a source line 54r, the drains thereof are coupled commonly with the coincidence line 2r, and the control gates thereof are coupled with the respective corresponding latch nodes LNR1 and LNR2.

The sources of the floating gate field effect transistors FDL1 and FDL2 are coupled commonly with the source line 54l, the drains thereof are coupled commonly with the coincidence line 21 and the control gates thereof are coupled with the respective latch nodes LNL1 and LNL2.

An output signal of a CMOS inverter circuit 52r receiving a voltage from a high voltage power supply 50r as a one operating power supply voltage is transmitted to the source line 54r, while an output signal of a CMOS inverter circuit 52l that operate, receiving an output voltage of the high voltage power supply 50l as a one operating power supply voltage, is transmitted to the common source line 54l. The CMOS inverter circuits 52r and 52l set voltage levels of the source lines 54r and 54l according to respective control voltages V1 and W1. In a normal operation such as a data read operation, the source lines 54r and 54l are held at the ground potential level.

In a case where the latch circuit LTH1 or LTH2 is a latch circuit corresponding to a defective bit line or a fixed defect, a threshold voltage of a corresponding floating gate field effect transistor is set high to be in the normally off state. Accordingly, a non-use latch circuit corresponding to a defective bit line or fixed defect can be prevented from exerting an adverse influence on a determining operation. This is because a latch node of a non-use latch circuit is isolated from a coincidence detection line and exerts no influence on a current on the coincidence detection line.

Now, description will be given of a programming operation (an operation by which a threshold voltage is raised) of a floating gate field effect transistor for determination (in the erased state as an initial state).

A case is considered where the latch circuit LTH1 is a latch circuit corresponding to a non-use address, while the latch circuit LTH2 is a latch circuit corresponding a use address. In this case, the latch nodes LNR1 and LNL1 of the latch circuit LTH1 are set to "1" and "0," respectively, by the forcibly setting circuit 5, while the latch nodes LNR2 and LNL2 of the latch circuit LTH2 are set to "0" and "1," respectively, by the forcibly setting circuit 5. In this state, voltage levels of power supply SP1 and SP2 of the respective latch circuits LTH1 and LTH2 are set to a high voltage level, for example of 10 V. On the other hand, voltage levels of the high voltage power supply 50r and 50l are set to 6 V, and the control signals V1 and W1 are set to H level and L level, respectively. The source line 54r is at the ground potential level of 0 V, while the source line 54l reaches a voltage level of 6 V supplied by the high voltage power supply 50l. Therefore, the floating gate field effect transistor FDR1 receives the high voltage of 10 V at the control gate thereof and 0V at the source node thereof. At this time, the coincidence detection lines 2r and 2l are set in the floating state. Accordingly, electrons are injected into the floating gate from the source region and a threshold voltage of the floating gate field effect transistor FDR1 is raised.

On the other hand, although the floating gate field effect transistor FDL2 provided for the latch circuit LTH2 receives the high voltage of 10 V at the control gate thereof, the source voltage thereof is a voltage produced by the high voltage power supply 50l and supplied from a CMOS inverter circuit 52l, and is 6V. Therefore, a voltage between the gate and source of the transistor FDL2 is small and there occurs no injection of electrons from the source region to the floating gate, whereby the floating gate field effect transistor FDL2 maintains the erased state.

The floating gate field effect transistors FDL1 and FDR2 receive a voltage of 0V at the control gates thereof and no injection of electrons into the respective floating gates occurs. Therefore, a threshold voltage of the floating gate field effect transistor FDR1 connected to the latch node LNR1 for a non-use address can be raised.

In a case where a threshold voltage of the floating gate field effect transistor FDL1 is raised, operations to be performed are in reverse to the above described ones. That is, the latch node LNL1 is set to "1" while the latch node LNR1 is set to "0." On the other hand, the latch nodes LNL2 and LNR2 of the latch circuit LTH2 are set to "0" and "1," respectively. The ground voltage is transmitted to the source line 54*l* and the high voltage 6 V is transmitted to the source line 54*r*. In this case, the control gate of the floating gate field effect transistor FDR1 is at the high voltage of 10 V and a voltage between the gate and source thereof is 10 V or so, therefore electrons are injected from the source into the floating gate to raise the threshold voltage. Therefore, when a threshold voltage of a determination MOS transistor provided for a latch node of a latch circuit for the non-use address is set sufficiently high so as to be in the normally off state, the latch nodes LNR1 are LNL1 exert no influence on the coincidence lines 2*r* and 2*l* regardless of voltage levels of the latch nodes LNR1 and LNL1. Accordingly, a latch circuit provided at a non-use address can be prevented from exerting an adverse influence on a determining operation, thereby enabling a correct determining operation.

It should be appreciated that as for the non-use addresses, defective bit information is stored which is detected in a defective bit repairing test performed after a fabrication process is completed, and programming on the floating gate field effect transistors FDR and FDL is performed based on the defect addresses, wherein addresses of a defective bit line and an unused redundant bit line are included in the non-use addresses.

Hence, in this case, even when a fixed defect is present in a latch circuit, regardless of whether a voltage level of the fixed defect is H level or L level, no influence is exerted on a determining operation using a latch circuit corresponding to the non-used address, enabling repairing of the fixed defect.

It should be appreciated that a source power supply circuit adjusting a voltage level of a source line in the memory array may be used for the CMOS inverters 52*r* and 52*l*, and the high voltage power supplies 50*l* and 50*r* for adjustment of the threshold voltages of the determination transistors, or alternatively, the CMOS inverters 52*r* and 52*l*, and the high voltage power supplies 50*l* and 50*r* may be dedicatedly used for programming the threshold voltages of the determinating transistors.

Operation controls of the forcibly setting circuit 5, the address decoder 6, the gate control circuit 7 and the like are performed by the control signal generating circuit 20*a* in the control circuit 24, similar to the third embodiment. When an operating mode is set to a mode of programming the determination floating field gate field effect transistor, necessary voltages are generated from the control signal generating circuit.

Configuration for Write Verification

Figure 13:
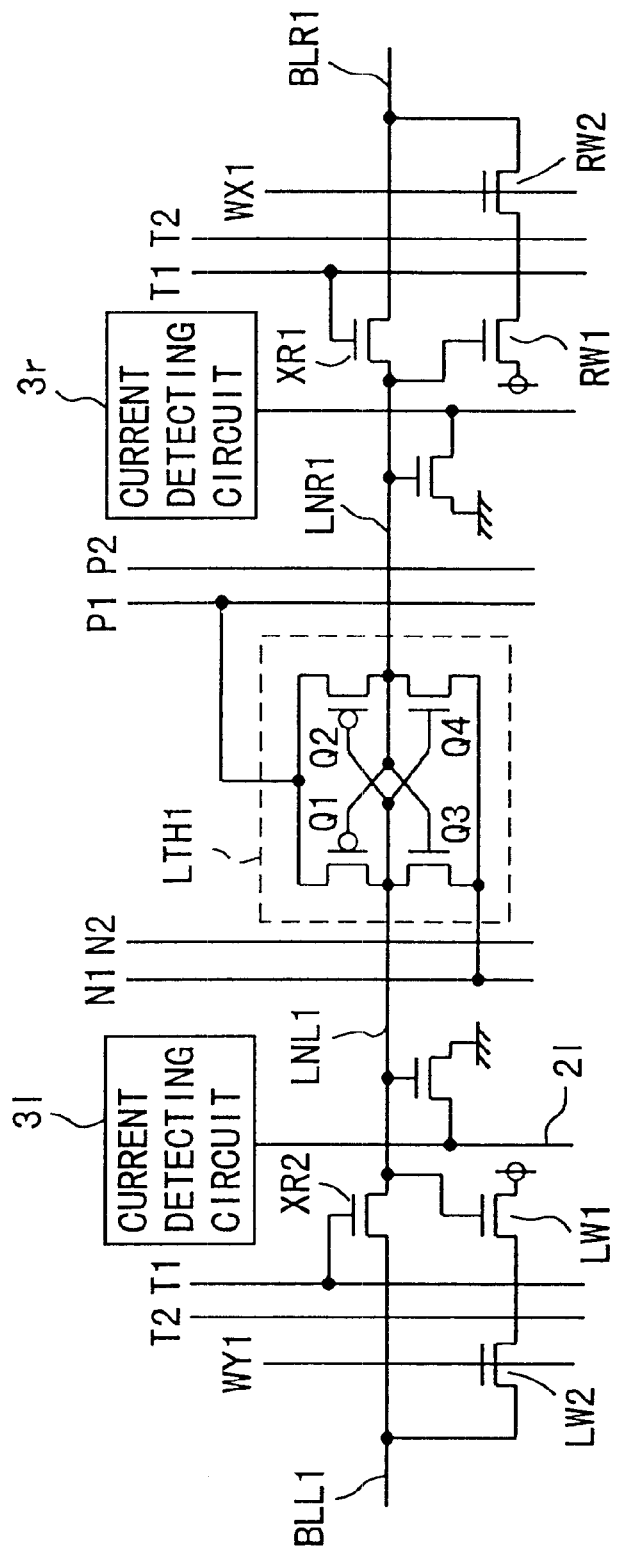
FIG. 13 is a circuit diagram representing an example of a configuration of a part performing programming/verification of a semiconductor memory device according to the present invention.
Figure 14:
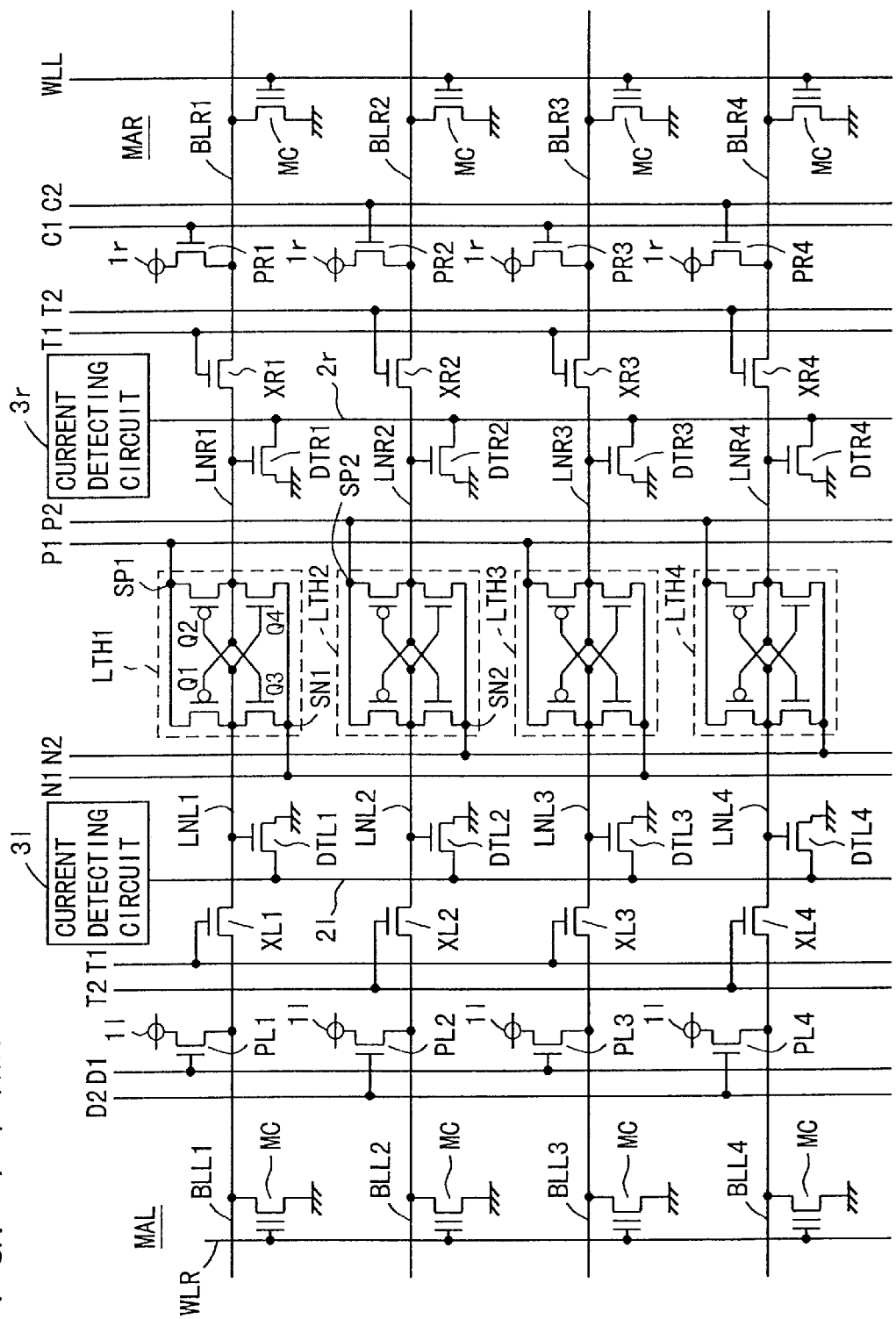
FIG. 14 is a circuit diagram representing a configuration of an array section of a conventional semiconductor memory device.
Figure 15:
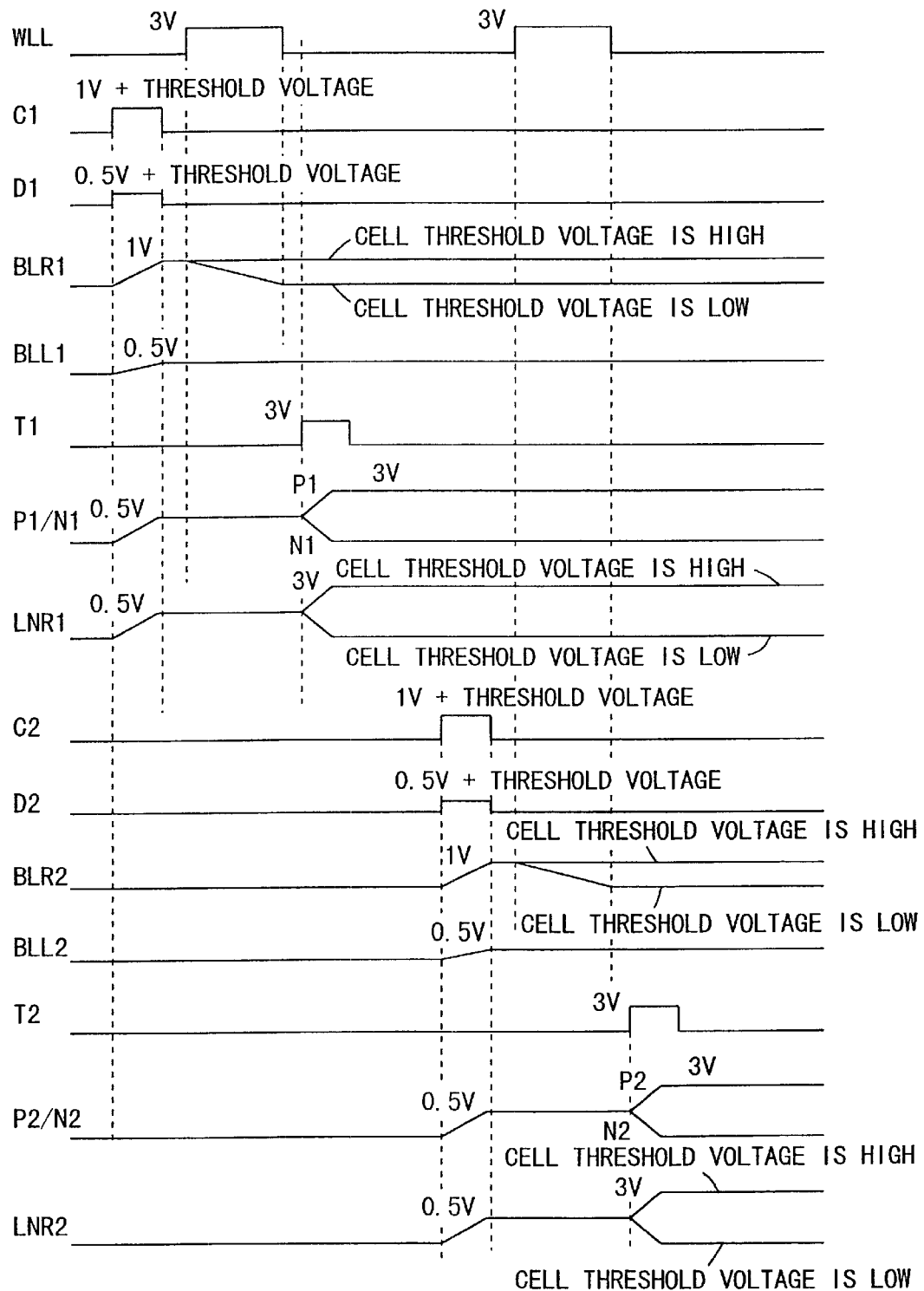
FIG. 15 is a signal waveform diagram representing a verification operation of a conventional semiconductor memory device.
Figure 16:
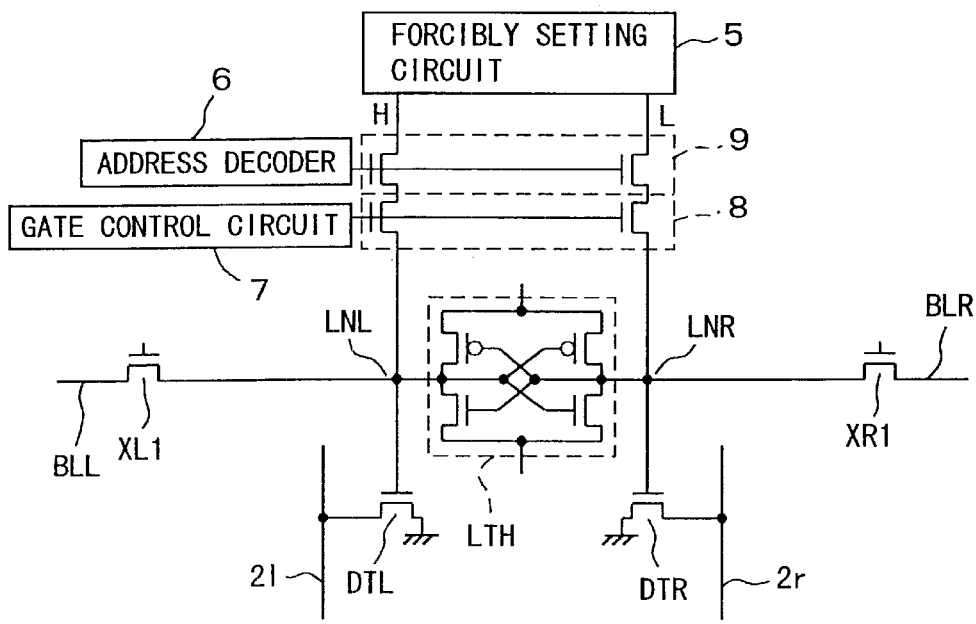
FIG. 16 is a block diagram schematically representing a configuration of a main part of a conventional semiconductor memory device.

FIG. 13 is a diagram representing a portion of circuitry for use in write verification. FIG. 13 represents a configuration of portions associated with the bit lines BLR1 and BLL1. The circuitry for write verification includes: an N channel MOS transistor RW1 becoming conductive in response to a signal on the latch node LNR1, and transmitting a power supply voltage Vcc when made conductive; an N channel MOS transistor RW2 connected serially to the N channel MOS transistor RW1 and becoming selectively conductive in response to a data detection instructing signal WX1 to connect the MOS transistor RW1 to the bit line BLR1; an N channel MOS transistor LW1 becoming selectively conductive in response to the potential of a signal on the latch node LNL1, and transmitting the power supply voltage Vcc when made conductive and an N channel MOS transistor LW2 connected between the MOS transistor LW1 and the bit line BLL1, and receiving a data detection instructing signal WY1 to a gate thereof. The other portion of the configuration is the same as any of the first to third embodiments.

In the configuration represented in FIG. 13, when a data "1" is written on a memory cell connected to the bit line BLR1, for example, the latch node LNR1 is set to "0" (L level) according to a write data provided from an outside. The transfer gate XR1 is opened and voltage levels of the sense drive signals P1 and P2 are raised. A voltage level of a selected word line is set to a high voltage (for example 10 V) while the transfer gate XR1 is open. Therefore, the bit line BLR1 having "0" latched on the latch node LNR1 transmits the ground voltage and the high voltage is applied between the control gate and source of an associated memory cell MC to raise a threshold voltage of the memory cell.

On the other hand, when the latch node is at H level ("1"), or the high voltage, for example of 6 V, is transmitted from the latch circuit LTH1 to the bit line BLR according to the sense drive signal P1, so that a voltage between the gate and source of the memory cell is small, whereby no injection of electrons are effected to the floating gate. In such a way, writing is completed.

In a verification operation following the completion of writing, read of a data on a memory cell is first performed in a state where the transfer gates XR1 and XR2 are turned off. That is, the bit line BLR1 is set, for example, to 1 V and the memory cell is driven to a selected state to change a voltage level of the bit line BLR1 according to the stored data. An intermediate voltage (for example, 0.5 V) is transmitted to the bit line BLL1. At this time, the data detection signal WX1 is set to H level. When the latch node LNR1 is at H level, the MOS transistors RW1 and RW2 are put into the on state and a voltage level of the bit line BLR1 rises beyond of 1 V.

When the latch node LNR1 is at H level, a memory cell connected to the bit line BLR1 is a memory cell on which "0" is written. Therefore, in this case, a voltage level of the bit line BLR1 is raised. Then, a precharge operation on a latch node to an intermediate voltage is performed, thereafter, the transfer gates XR1 and XR2 are put into the on state, and subsequently, a voltage level of the sense drive signal P1 applied to the latch circuit LTH is raised to perform a sensing operation and latch the signals on the latch nodes LNR1 and LNL1. When a "1" write operation is correctly performed on a memory cell, the bit line BLR1 potential is at a precharge voltage level higher than the intermediate voltage and the latch node LNR1 goes to H level.

On the other hand, in a case of a "1" write operation, when write is insufficient and the absolute value of the threshold voltage is small, a voltage level of the bit line BLR1 is lower than the intermediate voltage (the precharge voltage) and the latch node LNR1 goes to L level.

In a case of a memory cell on which a "0" write operation is performed, a voltage level of the bit line BLR1 is raised to the power supply voltage level according to the data detection signal WX1 and therefore, the latch node LNR1 is at H level. Accordingly, when the selected memory cells are all written with "1," the latch nodes LNRs are all at H level. In other words, this means that the latch nodes LNLs are all set to L level. Consequently, in a write verification operation on selected memory cells of the memory array MAR, in order to determine whether or not the latch nodes LNLs are all at L level ("0"), the current detecting circuit 3*l* is activated and it is determined whether or not a current flows on the coincidence line 2*l*. When no current flows on the coincidence line 2*l*, writing on the selected memory cells is complete. In such a way, write verification can be performed. A data to be rewritten is latched in the latch circuit LTH and rewrite can be internally performed.

Therefore, when not only a voltage level of the latch node but also a corresponding current detecting circuit in the above described erasure operation mode are reversed, a configuration for a write verification operation can be realized, and the first to fourth embodiments can therefore be applied in a write verification operation as well.

Other Applications

The present invention can be applied to a semiconductor memory device in which latch circuits each latching a data are provided and data transfer timings for the latch circuits are in a plurality of phases. For example, in a dynamic random access memory (DRAM), an activation timing of any given sense amplifier circuit is different in phase from that of an adjacent sense amplifier circuit (for reduction in consumed current), the present invention can be applied.

Further, the present invention can be applied to nonvolatile semiconductor memory device of any of a NOR type, an AND type, a DINOR type and a NAND type.

As described above, according to the present invention, even when a defect is present in a latch circuit latching a data, a semiconductor memory device is configured such that the defect is prevented from exerting an adverse influence on a determining operation, thereby enabling repairing on a defect in the latch circuit section and increase in a product yield.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a first memory array having a plurality of memory cells disposed in rows and columns;
   a plurality of bit lines provided corresponding to respective memory cell columns of said first memory array, and each for transferring a data of a memory cell on a corresponding column;
   a plurality of latch circuits provided corresponding to respective bit lines, each for latching a received data when made active;
   a plurality of transfer gates each provided between the latch circuit and a corresponding bit line and connecting said latch circuit and said corresponding bit line in response to a transfer instructing signal;
   a latch drive signal line for transmitting a latch drive signal to said plurality of latch circuits, said latch drive signal line supplying an operating power supply voltage to power supply nodes of the latch circuits to activate each of the latch circuits; and
   a plurality of reverse current preventing elements each provided corresponding to the power supply node of the latch circuit and said latch drive signal line and for preventing a current from flowing from a corresponding power supply node to said latch drive signal line while allowing the current to flow from the latch drive signal line to the corresponding power supply node.

2. The semiconductor memory device according to claim 1, wherein said latch drive signal line transmits a positive voltage as said latch drive signal for activation of said plurality of latch circuits, and
   the reverse current preventing elements each comprises a diode element connected from the power supply node of a corresponding latch circuit to said latch drive signal line in a backward direction.

3. The semiconductor memory device according to claim 2, wherein said diode element comprises a diode-connected insulated gate field effect transistor.

4. The semiconductor memory device according to claim 1, wherein said plurality of transfer gates are divided into two groups comprising: a first transfer gate group including transfer gates each coupling a corresponding bit line with a corresponding latch circuit in response to a first transfer instructing signal; and a second transfer gate group including transfer gates each coupling a corresponding bit line with a corresponding latch circuit in response to a second transfer instructing signal activated at a timing different from that of said first transfer instructing signal.

5. The semiconductor memory device according to claim 1, further comprising:
   a second memory array having a plurality of memory cell disposed in rows and columns, memory cell columns of said second memory array being disposed corresponding to the respective columns of said first memory array;
   a plurality of bit lines provided corresponding to the respective columns of said second memory array, each for transferring a data of a memory cell on a corresponding column;
   a plurality of second transfer gates each provided corresponding to a bit line provided in said second memory array and for coupling a corresponding bit line with a corresponding latch circuit in response to said transfer instructing signal, wherein
   each of said plurality of latch circuits comprises a circuit performing differential amplification on voltages transmitted through corresponding bit lines of said first and second memory arrays.

6. A semiconductor memory device comprising:
   a first memory array having a plurality of memory cells disposed in rows and columns;
   a plurality of first bit lines, provided corresponding to the respective memory cell columns of said first memory array, each for transferring a data of a memory cell on a corresponding column;
   a plurality of latch circuits each having first and second latch nodes and latching complementary signals on said first and second latch nodes thereof when activated;
   a plurality of first transfer gates, provided corresponding to the respective first bit lines, each for coupling a corresponding first bit line with said first latch node of a corresponding latch circuit in response to a transfer instructing signal;
   a second memory array having a plurality of memory cell disposed in rows and columns, the columns of said second memory array being disposed corresponding to the columns of said first memory array;
   a plurality of second bit lines, provided corresponding to the respective columns of said second memory array, each for transferring a data of a memory cell on a corresponding column;
   a plurality of second transfer gates provided corresponding to the second bit lines, each for coupling a corresponding second bit line with said second latch node of a corresponding latch circuit in response to said transfer instructing signal;
   a first determining circuit for determining whether the first latch nodes of said plurality of latch circuits are all at a first logic level;

a second determining circuit for determining whether the second latch nodes of said plurality of latch circuits are all at a second logic level;

a plurality of inverter circuits, provided corresponding to the respective latch circuits, each for inverting latched signals on said first and second latch nodes of a corresponding latch circuit;

information storing circuitry for storing information indicating whether said first determining circuit is available; and a control circuit for enabling either of said first determining circuit, and a set of the inverter circuits and said second determining circuit according to stored information in said information storing circuitry.

7. The semiconductor memory device according to claim 6, wherein of said plurality of latch circuits include a first latch circuit used in a normal operating mode in which data access is effected; and a second latch circuit non-used in said normal operating mode, and said semiconductor memory device further comprises forcing circuitry for forcibly setting a latch signal on said second latch circuit to a prescribed state, and said control circuit is enabled after a forced setting operation by said forcing circuitry is completed.

8. The semiconductor memory device according to claim 6, wherein said information storing circuitry stores first information indicating whether a first latch node of said plurality of first latch nodes is fixed to the first logic level, and second information indicating whether a first latch node of said plurality of first latch nodes is fixed to the second logic level, and said control circuit enables said first determining circuit when said information storing circuit stores the second information, and enables the set of the inverter circuits and the second determining circuit when said information storing circuit stores the first information.

9. The semiconductor memory device according to claim 6, wherein said control circuit enables, in a second operation mode, either of a set of the first determining circuit and the inverter circuits, and the second determining circuit in accordance with the information stored in said information storing circuit.

10. The semiconductor memory device according to claim 9, wherein said information storing circuitry stores information indicating whether a first latch node of said plurality of first latch nodes is fixed to the first logic level, and second information indicating whether a first latch node of said plurality of first latch nodes is fixed to the second logic level, and said control circuit enables said second determining circuit when said information storing circuit stores the first information, and enables the set of the inverter circuits and the first determining circuit when said information storing circuit stores the second information.

11. A semiconductor memory device comprising:

a memory array having a plurality of memory cells disposed in rows and columns;

a plurality of bit lines, provided corresponding to the respective memory cell columns of said memory array, each for transferring a data of a memory cell on a corresponding column;

a plurality of latch circuits, provided corresponding to the bit lines, each for latching a received data;

a plurality of transfer gates, provided corresponding to the respective memory cell columns, each for coupling a corresponding bit line with a corresponding latch circuit in response to a transfer instructing signal;

forcibly setting circuitry for forcibly setting a latch state of a predetermined latch circuit among said plurality of latch circuits to a predetermined state, said predetermined latch circuit comprising a second latch circuit non-used in a normal operating mode in which data access is effected;

a determining circuit for determining whether signals latched by said plurality of latch circuits are all at the same logic level; and control circuitry for activating said determining circuit under a state where said second latch circuit is forcibly set in the predetermined state, after forcible setting of the latch state of said second latch circuit by said forcibly setting circuit.

12. The semiconductor memory device according to claim 11, where in said second latch circuit is provided in plurality, and said control circuitry comprises a circuit for activating said determining circuit under a state in which said second latch circuit provided in plurality is sequentially forcibly set to said predetermined state one by one.

* * * * *